(12) United States Patent
Mochizuki et al.

(10) Patent No.: US 6,461,927 B1
(45) Date of Patent: Oct. 8, 2002

(54) SEMICONDUCTOR DEVICE AND METHOD OF PRODUCING THE SAME

(75) Inventors: Kazuhiro Mochizuki, Tokyo; Tohru Oka, Osaka; Isao Ohbu, Sagamihara; Kiichi Yamashita, Shiroyama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/939,671

(22) Filed: Aug. 28, 2001

(30) Foreign Application Priority Data

Feb. 23, 2001 (JP) .......................... 2001-047545

(51) Int. Cl.⁷ ............................................ H01L 21/331
(52) U.S. Cl. .......................... 438/369; 438/315
(58) Field of Search ............................ 438/315, 317, 438/320, 334, 369

(56) References Cited

U.S. PATENT DOCUMENTS 5,289,020 A * 2/1994 Hirose et al. ............... 257/197
5,757,039 A * 5/1998 Delaney et al. ............. 257/198

FOREIGN PATENT DOCUMENTS

JP 10-135750 5/1998

OTHER PUBLICATIONS

Mochizuki, R. J. et al, "GaInP/GaAs collector–up tunnelling–collector heterojunction bipolar transistors with zero–offset and low–knee–voltage characteristics", *Electronics Letters*, vol. 36, Feb. 3, 2000, pp. 264–265.
Mochizuki et al. ;GaInP/GaAs . . . (C–Up TC–HBTs): Optimization of Fabrication Process and Epitaxial Layer Structure for High–Efficiency High–Power Amplifiers, IEEE Transactions on Electron Devices, vol. 47, No. 12, Dec. 2000, pp. 2277–2283.*

* cited by examiner

Primary Examiner—John F. Niebling
Assistant Examiner—Christopher Lattin
(74) Attorney, Agent, or Firm—Miles & Stockbridge P.C.

(57) ABSTRACT

In the case of a semiconductor device where a base electrode 11 in a collector top heterojunction bipolar transistor is disposed so as to contact with the side face of a base layer 5 in which no ion is implanted and the surface of a high resistance extrinsic emitter area 14 in which ion is implanted, the dependence of the current gain in the collector top HBT on the collector size can be diminished.

4 Claims, 17 Drawing Sheets

SEMICONDUCTOR DEVICE AND METHOD OF PRODUCING THE SAME

BACKGROUND OF THE INVENTION

The present invention relates to a semiconductor device using a collector top heterojunction bipolar transistor, and particularly to a power amplifier high in power conversion efficiency.

With recent rapid increase in demand for mobile communication equipment, research and development of power amplifiers used for communication equipment have been made extensively. For example, JP-A-10-135750 discloses power amplifiers in which heterojunction bipolar transistors (HBTs) are used as semiconductor devices.

FIG. 23 shows a circuit diagram of a two-stage amplifier using a monolithic-microwave integrated circuit as an example of the power amplifiers. In FIG. 23, an input matching circuit as a circuit which determines the input impedance is connected for input and an output matching circuit as a circuit which determines the output impedance is connected for output. (These are not shown in the circuit diagram 23 because they are formed by an outer passive device outside the integrated circuit.) In order to improve the power conversion efficiency of the power amplifier as shown in FIG. 23, it is essential (1) to improve the power conversion efficiency of driver-stage HBT and output-stage HBT and (2) to reduce power consumption in bias circuit.

As for (1), it is effective to reduce the knee voltage of HBT (a minimum collector-emitter voltage at an operating maximum collector current). The knee voltage of HBT is determined depending on offset voltage (collector to emitter voltage when collector current becomes zero) and emitter resistance and collector resistance. It is known that the off-set voltage of HBT is lower in collector top HBT having a collector formed on the surface side than in emitter top HBT having an emitter formed on the surface side, and a collector top HBT low in off-set voltage is disclosed in "Electronics Letters", Vol. 36, No.3, pp. 264–265 (2000).

As for (2), it is important to maintain a proper current gain. The power consumption of bias circuit decreases with increase of current gain of driver-stage HBT and output-stage HBT. However, the high current gain exceeding, for example, 70 to 100 causes decrease of collector-emitter breakdown voltage, resulting in lowering of reliability of power amplifiers. Therefore, about 50 is desirable as a current gain of the driver-stage HBT and the output-stage HBT.

However, in case a prior art collector top HBT (FIG. 31) is employed for (1), there is a problem that even if a current gain of about 50 is obtained in the case of a large area HBT of about 100×100 $\mu m^2$ in collector size, the current gain is smaller than 10 in an HBT of lower collector size used as a transistor finger of power amplifier, for example, an HBT of 2×20 $\mu m$ in collector size (FIG. 32). Thus, there is a problem that even if the power conversion efficiency of the driver-stage HBT and the output-stage HBT is improved by employing the collector top HBT, the power conversion efficiency of the whole power amplifier is not improved as a result of increase of the power consumption of bias circuit.

BRIEF SUMMARY OF THE INVENTION

An object of the present invention is to diminish the dependence of current gain in collector top HBT on the size of collector.

The above object can be attained in the following manner. That is, the base layer of collector top heterojunction bipolar transistor is disposed not so as to cover the whole high resistance extrinsic emitter area, and the base electrode is allowed to be present on the high resistance extrinsic emitter area and electrically connected to the side face of the base layer.

Furthermore, the above object can be attained by the method for producing a collector top heterojunction bipolar transistor which comprises a step of growing an emitter layer comprising an n-type compound semiconductor on a single crystal semiconductor substrate, a step of growing on the emitter layer a base layer comprising a p-type compound semiconductor having a forbidden band width smaller than that of the compound semiconductor constituting the emitter layer, a step of processing the base layer into a desired shape, and a step of forming by ion implantation a high resistance extrinsic emitter area on the area of the emitter layer which is not covered with the base layer.

Figure 1:
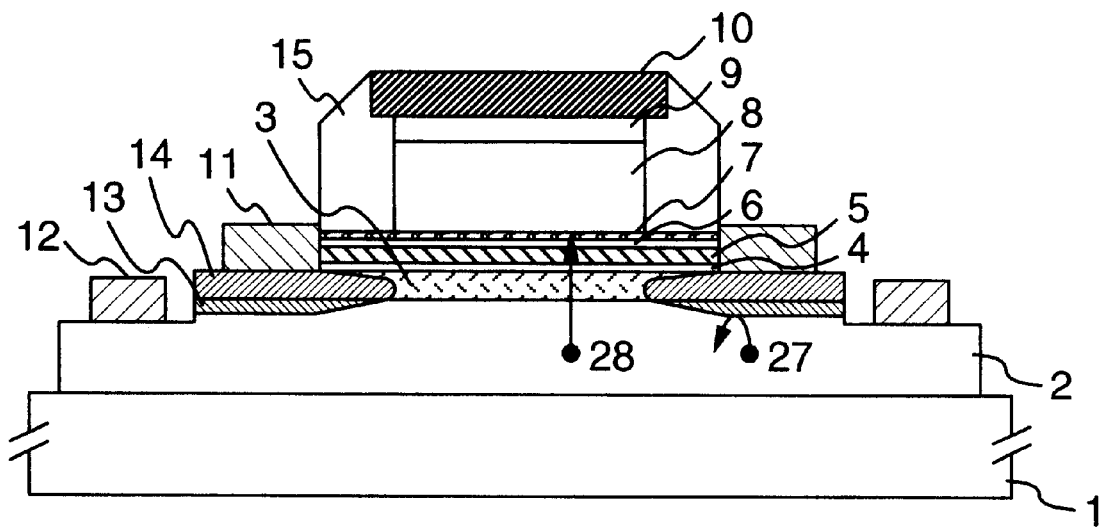
FIG. 1 is a longitudinal sectional view showing the structure of a collector top HBT used in the semiconductor device of the first and second examples of the present invention.

The reference numerals used in FIG. 1 to FIG. 34 will be explained below.

1 - - - Semiconductor substrate, 2 - - - Subemitter layer, 3 - - - Emitter layer, 4 - - - Spacer layer, 5 - - - Base layer, 6 - - - Spacer layer, 7 - - - Etch stop layer, 8 - - - Collector layer, 9 - - - Cap layer, 10 - - - Collector electrode, 11 - - - Base electrode, 12 - - - Emitter electrode, 13 - - - High resistance sub-emitter area, 14 - - - High resistance emitter area, 15 - - - Insulating film side wall, 16 - - - Photo resist pattern, 17 - - - Planarized photo resist, 18 - - - Isolation region between elements, 19 - - - Layer insulating film, 20 - - - Collector wiring metal, 21 - - - Alloy electrode on the back side of emitter, 22 - - - Dummy collector electrode, 23 - - - Collector contact hole, 24 - - - Non-alloy electrode on the back side of the emitter electrode, 25 - - - Etch stop layer, 26 - - - Contact layer on the back side of emitter, 27 - - - Electron which cannot penetrate into extrinsic emitter owing to discontinuity of conduction band, 28 - - - Electron which reaches collector, 36 - - - Electrons recombining in outer base, 51 - - - Implanted ion, 61 - - - Driver-stage HBT and output-stage HBT, 62 - - - HBT for bias circuit, 63 - - - Resistance element, 64 - - - Inductance element, 65 - - - Capacitance element, 71 - - - First layer insulating film, 72 - - - Second layer insulating film, 73 - - - First wiring metal, 74 - - - Second wiring metal, 75 - - - Insulating film, 76 - - - Resistance film, 101 - - - Metallic cap, 102 - - - Chip parts, 103 - - - Transmission line, 104 - - - Bonding wire, 105 - - - Monolithic microwave integrated circuit, 106 - - - Thermal via, 107, 108, 109 - - - Ground layer, 110 - - - Bias line, 600 - - - Receiver part, 601 - - - Transmitter part, 611 - - - Low noise amplifier, 612 - - - Receiver mixer, 613 - - - Intermediate frequency amplifier, 614 - - - Demodulator, 621 - - - Power amplifier, 622 - - - Transmitter mixer, 623 - - - Modulator, 630 - - - Frequency synthesizer, 640 - - - Antenna, 641 - - - Antenna multicoupler, 650 - - - Control part.

DETAILED DESCRIPTION OF THE INVENTION

Hitherto, in order to control the base current which passes through an extrinsic emitter·base junction in the production of collector top HBTs, ions such as hydrogen, helium, beryllium, boron, carbon, nitrogen, oxygen, fluorine, and neon are implanted into the extrinsic emitter area through the outer base area using the collector electrode and the collector mesa as masks, thereby increasing the resistance of the extrinsic emitter area. In this case, in order that the current gain of the collector top HBT exceeds 1, area of the emitter·base junction must be smaller than that of the base·collector junction. The reduction of collector mesa for collector electrode is about 0.3 $\mu$m while the distance of diffusion in lateral direction of crystal defects produced under the usual ion implantation conditions during the production of the collector top HBT is about 0.3 to 0.5 $\mu$m, and thus the relation that the area of the emitter-base junction is smaller than that of the base-collector junction is satisfied. However, no attention has been paid to the fact that the diffusion of crystal defects in lateral direction occurs not only in the emitter layer, but also in the base layer.

Figure 31:
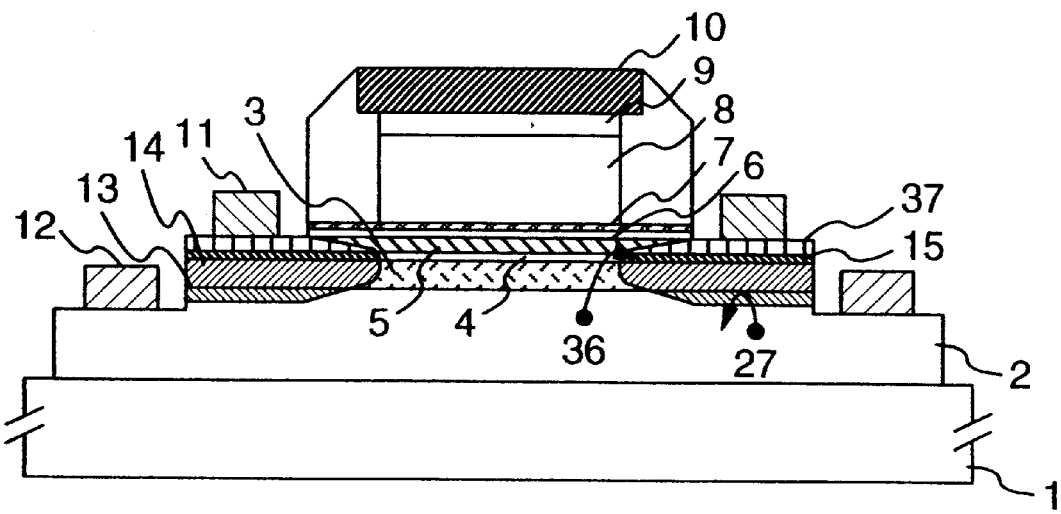
FIG. 31 is a longitudinal sectional view showing the structure of a collector top HBT used in a semiconductor device of a prior art.
Figure 32:
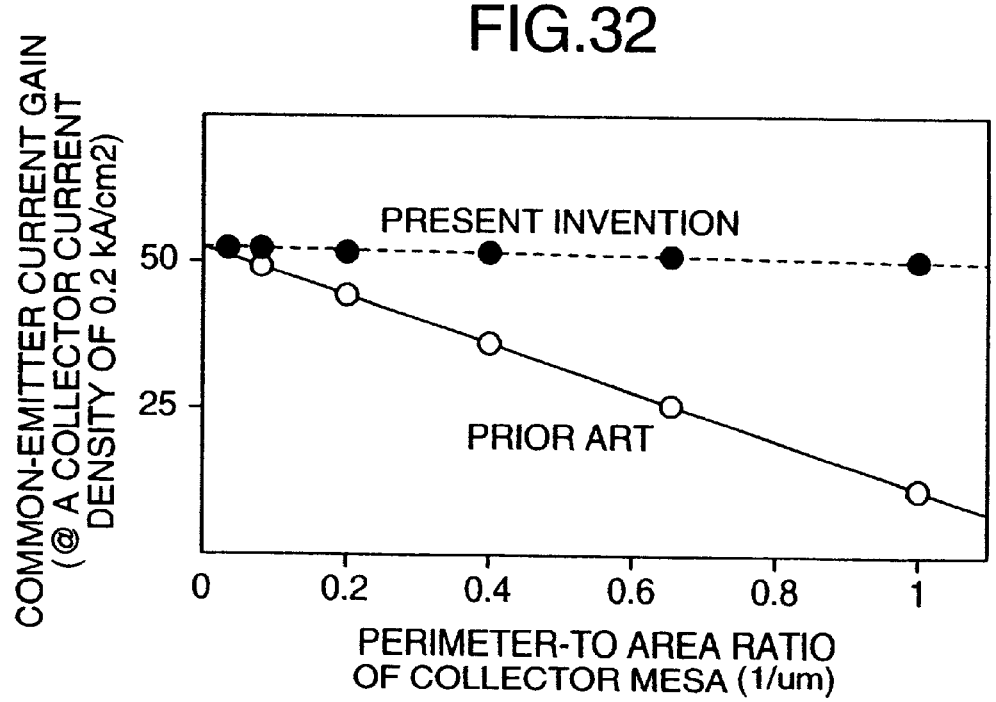
FIG. 32 is a graph which shows the results of measurement of dependence of current gain on collector mesa size in collector top HBT used in the power amplifiers according to a prior art and the present invention.

Therefore, first, a collector top HBT was produced according to prior art, and dependence of base current on collector size was examined. If carriers recombine through crystal defects in emitter depletion layer, ideality factor value n (value of n when current is expressed by $A\exp(qV/nkT)$ (A: proportionality factor, q: elemental charge, V: voltage, k: Boltzmann constant, T: absolute temperature) should be 2, and n should be 1 if recombination current dominates through the defects in the neutral base area. The prior art collector top HBT shown in FIG. 31 was actually produced, and dependence of base current on collector current was analyzed. As a result, the ideality factor value n was 1.0. From the result, it becomes clear that dependence, on collector size, of current gain of the prior art collector top HBT shown in FIG. 31 is mainly due to the crystal defects in the base layer.

The present invention is characterized in that the ion implantation is carried out not through the outer base area, and the base electrode is formed extending over the low resistance base layer in which ion implantation is not performed and the high resistance extrinsic emitter area in which ion implantation is performed.

Preferred embodiments of the present invention will be explained below.

(1) A semiconductor device, characterized in that it has a collector top heterojunction bipolar transistor, the base layer does not cover the whole high resistance extrinsic emitter area, and the base electrode is present on the high resistance extrinsic emitter area and electrically connected to a side face of the base layer.

(2) A semiconductor device mentioned in the above (1), wherein the base electrode is electrically connected to the upper surface of the base layer.

(3) A semiconductor device mentioned in the above (1) or (2), wherein the high resistance extrinsic emitter area contains at least one element selected from hydrogen, helium, beryllium, boron, carbon, nitrogen, oxygen, fluorine and neon.

(4) A semiconductor device using a collector top heterojunction bipolar transistor which has a single crystal semiconductor substrate, a sub-emitter layer formed on the substrate and comprising an n-type compound semiconductor, an emitter layer formed on the sub-emitter layer and comprising an n-type compound semiconductor larger in forbidden band width than the compound semiconductor constituting the sub-emitter layer, a base layer formed on the emitter layer and comprising a p-type compound semiconductor smaller in forbidden band width than the compound semiconductor constituting the emitter layer, a collector layer formed on the base layer and comprising an n-type compound semiconductor having a forbidden band width equal to or larger than that of the compound semiconductor constituting the base layer, a cap layer formed on the collector layer and comprising an n-type compound semiconductor higher in impurity concentration than the collector layer, and a collector electrode, a base electrode and an emitter electrode electrically connected to the cap layer, the base layer and the sub-emitter layer, respectively, characterized in that the base electrode is formed in contact with the side face of the base layer and the surface of the emitter layer, and the area of the emitter layer which contacts with at least the base electrode contains at least one element of hydrogen, helium, beryllium, boron, carbon, nitrogen, oxygen, fluorine and neon.

(5) A semiconductor device mentioned in the above (4), wherein the distance from mesa end of the collector to the side face of the base layer is not more than 0.5 $\mu$m, and the distance in the direction of linking the collector mesa end of the base electrode present on the base layer with the side face of the base layer is not more than 0.3 $\mu$m.

(6) A semiconductor device mentioned in the above (4) or (5), wherein the single crystal semiconductor substrate is GaAs, and the sub-emitter layer comprises an InGaAsN layer and a GaAs layer laminated in succession on the GaAs single crystal semiconductor substrate.

(7) A semiconductor device mentioned in the above (4) or (5), wherein the single crystal semiconductor substrate is InP, and the sub-emitter layer comprises an InGaAs layer and an InAlAs layer laminated in succession on the InP single crystal semiconductor substrate.

(8) A semiconductor device mentioned in any one of the above (1) to (7), wherein the bipolar transistor has collector fingers, the space between the collector fingers is not less than 2 $\mu$m and not more than 10 $\mu$m, and the emitter electrode is formed on the side of the single crystal semiconductor substrate of the bipolar transistor which is opposite to the side on which the base electrode is formed.

(9) A semiconductor device mentioned in the above (8), wherein the collector fingers are disposed in the area which is inside a circular or rectangular doughnut-shaped dummy collector electrode which is electrically insulated from the collector fingers.

(10) A monolithic-microwave integrated circuit having a single crystal semiconductor substrate, a plurality of amplifiers formed on the single crystal semiconductor substrate and a drive-stage matching circuit connecting the amplifiers, characterized in that the amplifier comprises the collector top heterojunction bipolar transistor of the semiconductor device mentioned in any one of the above (1) to (9), and the thickness of the single crystal semiconductor substrate of the area in which the driver-stage matching circuit is formed on the input side of the output-stage transistor of the amplifier is thicker than the thickness of the single crystal semiconductor substrate in the area in which the output-stage transistor is formed.

(11) A module having the monolithic-microwave integrated circuit mentioned in the above (10).

(12) A mobile communication equipment having the power amplifier module mentioned in the above (11).

(13) A millimeter wave region amplifier module having the monolithic-microwave integrated circuit mentioned in the above (10).

(14) A method for producing a collector top heterojunction bipolar transistor which comprises a step of growing an emitter layer comprising an n-type compound semiconductor on a single crystal semiconductor substrate, a step of growing on the emitter layer a base layer comprising a p-type compound semiconductor smaller in forbidden band width than the compound semiconductor constituting the emitter layer, a step of processing the base layer into a desired form, and a step of forming by ion implantation a high resistance extrinsic emitter area in the area of the emitter layer which is not covered with the base layer.

(15) A method for producing a collector top heterojunction bipolar transistor mentioned in the above (14), wherein the ion implantation comprises implanting ion of at least one element of hydrogen, helium, beryllium, boron, carbon, nitrogen, oxygen, fluorine and neon.

(16) A method for producing a collector top heterojunction bipolar transistor mentioned in the above (14) or (15), wherein the single crystal semiconductor comprises GaAs, the emitter layer comprises InGaP or AlGaAs, and the base layer comprises GaAs.

(17) A method for producing a collector top heterojunction bipolar transistor mentioned in the above (14) or (15), wherein the single crystal semiconductor comprises InP, the emitter layer comprises InAlGaAs or InP, and the base layer comprises InGaAs.

The present invention will be specifically explained by the following examples, which should not be construed as limiting the invention in any manner.

EXAMPLE 1

FIG. 1 is a longitudinal sectional view of a collector top HBT used in the power amplifier which is the first example of the present invention. On a semi-insulating GaAS substrate 1 are present a highly doped n-type GaAs sub-emitter layer 2 (Si concentration: $5 \times 10^{18}$ cm$^{-3}$, film thickness: 0.8 $\mu$m), an n-type InGaP emitter layer 3 (InP molar ratio: 0.5, Si concentration: $5 \times 10^{17}$ cm$^3$, film thickness: 0.2 µm), an undoped GaAs spacer layer 4 (film thickness: 5 nm), a p-type GaAs base layer 5 (C concentration: $3 \times 10^{19}$ cm$^{-3}$, film thickness: 70 nm), an undoped GaAs spacer layer 6 (film thickness: 20 nm), an n-type InGaP etch stop layer 7 (InP molar ratio: 0.5, Si concentration: $3 \times 10^{17}$ cm$^{-3}$, film thickness: 5 nm), an n-type GaAs collector layer 8 (Si concentration: $3 \times 10^{16}$ cm$^{-3}$, film thickness: 0.8 pm), and an n-type InGaAs cap layer 9 (InAs molar ratio: 0.5, Si concentration: $1 \times 10^{19}$ cm$^{-3}$, film thickness: 0.2 µm), and a collector electrode 10 and a base electrode 11 are formed in self alignment with an SiO$_2$ side wall 15 being present between the electrodes. On the other hand, an emitter electrode 12 is formed in non-self alignment in respect to the base mesa. Here, a high resistance InGaP extrinsic emitter area 14 and a high resistance GaAs extrinsic sub-emitter area 13 in which boron ion is implanted are present in the transistor extrinsic area (the area other than the transistor intrinsic area just under the collector electrode 10) in the emitter layer 3 and the sub-emitter emitter layer 2, thereby controlling the base current (flow 27 of electron in FIG. 1) flowing through the extrinsic emitter-base junction. As the ion to be implanted, in addition to boron, there may be used any of hydrogen, helium, beryllium, carbon, nitrogen, oxygen, fluorine or neon to similarly form the high resistance areas 13 and 14. The current gain of the collector top HBT having a collector size of $2 \times 20$ µm$^2$ in this example was 55. This value is the same as the current gain in the case of $100 \times 100$ µm$^2$ in collector size, and thus the dependence of current gain on collector size which was a problem in the prior art could be inhibited.

Figure 2:
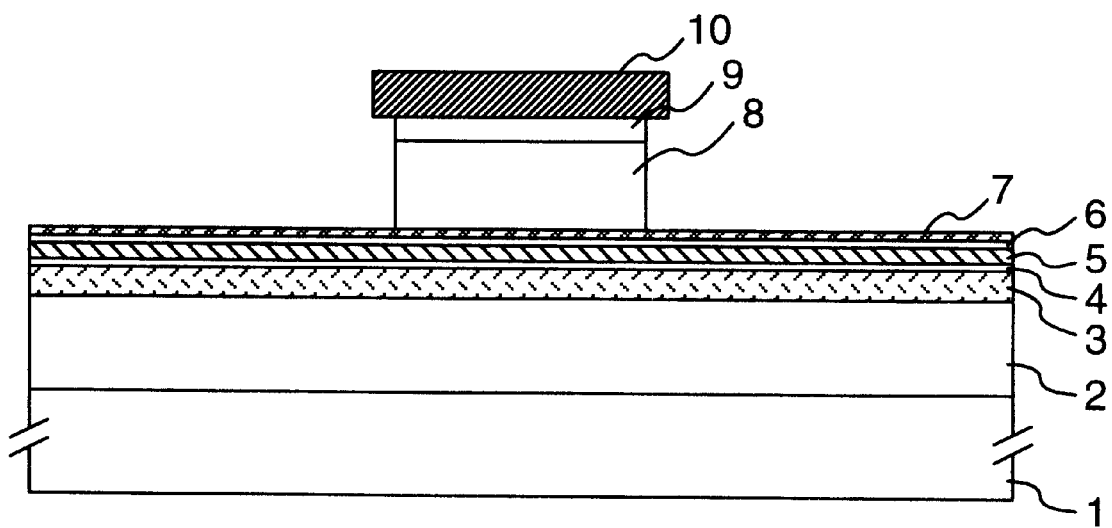
FIG. 2 shows production steps of a collector top HBT used in the semiconductor device of the first and second examples of the present invention.

Next, a method of the production of the collector top HBT shown in FIG. 1 will be explained referring to FIG. 2 to FIG. 10. First, the highly doped n-type GaAs sub-emitter layer 2, the n-type InGaP emitter layer 3, the undoped GaAs spacer layer 4, the p-type GaAs base layer 5, the undoped GaAs spacer layer 6, the n-type InGaP etch stop layer 7, the n-type GaAs collector layer 8, and the n-type InGaAs cap layer 9 were successively epitaxially grown on the semi-insulating GaAs substrate 1 using a metalorganic vapor phase epitaxy method or a molecular beam epitaxy method. Here, the n-type InGaP etch stop layer 7 has the effect to reduce the off-set voltage by inhibiting the injection of holes into the collector from the base, but this layer is not essential for the operation of the collector top HBT. Thereafter, WSi (Si molar ratio: 0.3, film thickness: 0.3 µm) was deposited on the whole surface of the wafer using a RF sputtering method, and the collector electrode 10 was formed by photolithography and dry etching using CF$_4$. Then, using this collector electrode 10 as a mask, the n-type InGaAs cap layer 9 and the n-type GaAs collector layer 8 were removed by dry etching using SF$_6$ and SiCl$_4$ and wet etching using a mixed solution comprising phosphoric acid, hydrogen peroxide and water. In this case, the n-type InGaP etch stop layer 7 was not etched by wet etching with the mixed solution comprising phosphoric acid, hydrogen peroxide and water, and the surface of the n-type InGaP etch stop layer 7 was exposed (FIG. 2).

Figure 3:
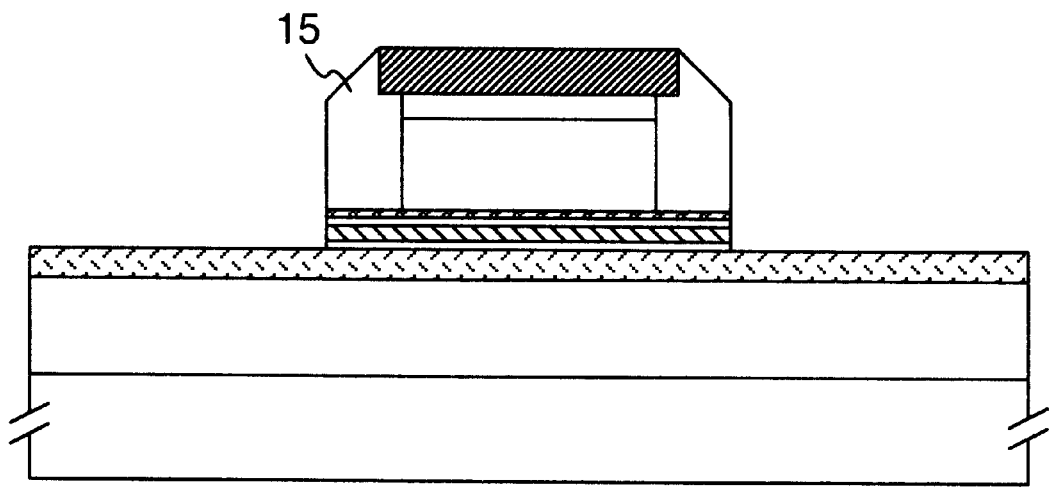
FIG. 3 shows production steps of a collector top HBT used in the semiconductor device of the first and second examples of the present invention.
Figure 4:
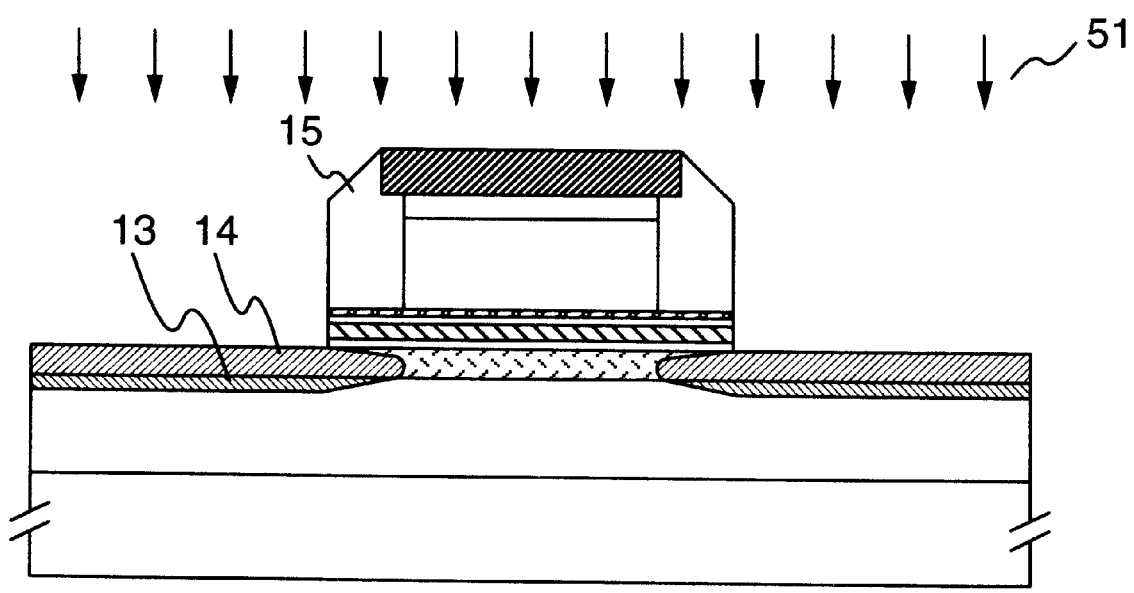
FIG. 4 shows production steps of a collector top HBT used in the semiconductor device of the first and second examples of the present invention.

Thereafter, an SiO$_2$ film (film thickness: 400 nm) was deposited at 390° C. using a thermal decomposition chemical vapor deposition method, and the SiO$_2$ side wall 15 was processed by dry etching with C$_2$F$_6$ and CHF$_3$. Subsequently, the n-type InGaP etch stop layer 7 was removed with an aqueous hydrochloric acid solution using the collector electrode 10 and the SiO$_2$ side wall 15 as masks, and the undoped GaAs spacer layer 6 and the p-type GaAs base layer 5 were removed by wet etching with a mixed solution comprising phosphoric acid, hydrogen peroxide and water to expose the surface of then-type InGaP emitter layer 3 (FIG. 3).

Then, boron ions 51 were implanted into the whole surface at room temperature under the conditions of an acceleration energy of 50 keV, an angle of incidence of 0°, and a dose of $2 \times 10^{12}$ cm$^{-2}$. In this case, the crystal defects formed by the ion implantation diffused in lateral direction, and the high resistance InGaP extrinsic emitter area 14 and the high resistance GaAs extrinsic sub-emitter area 13 expanded in lateral direction. This expansion width further expanded at the subsequent heating step of the production steps, and after completion of the production steps, the expansion width was estimated to be about 0.3 µm to 0.5 µm from the dependence of the collector current on the collector mesa size.

Figure 5:
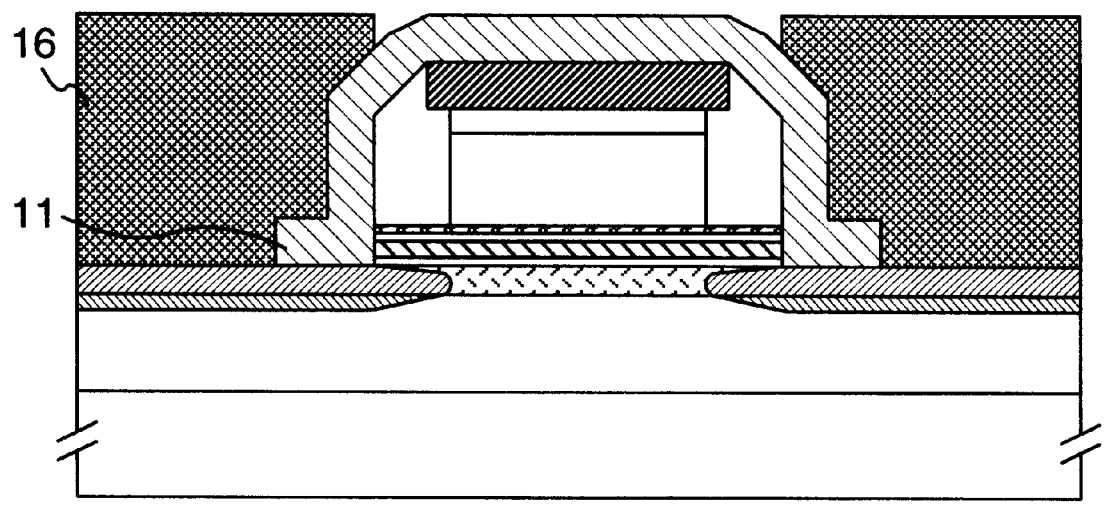
FIG. 5 shows production steps of a collector top HBT used in the semiconductor device of the first and second examples of the present invention.
Figure 6:
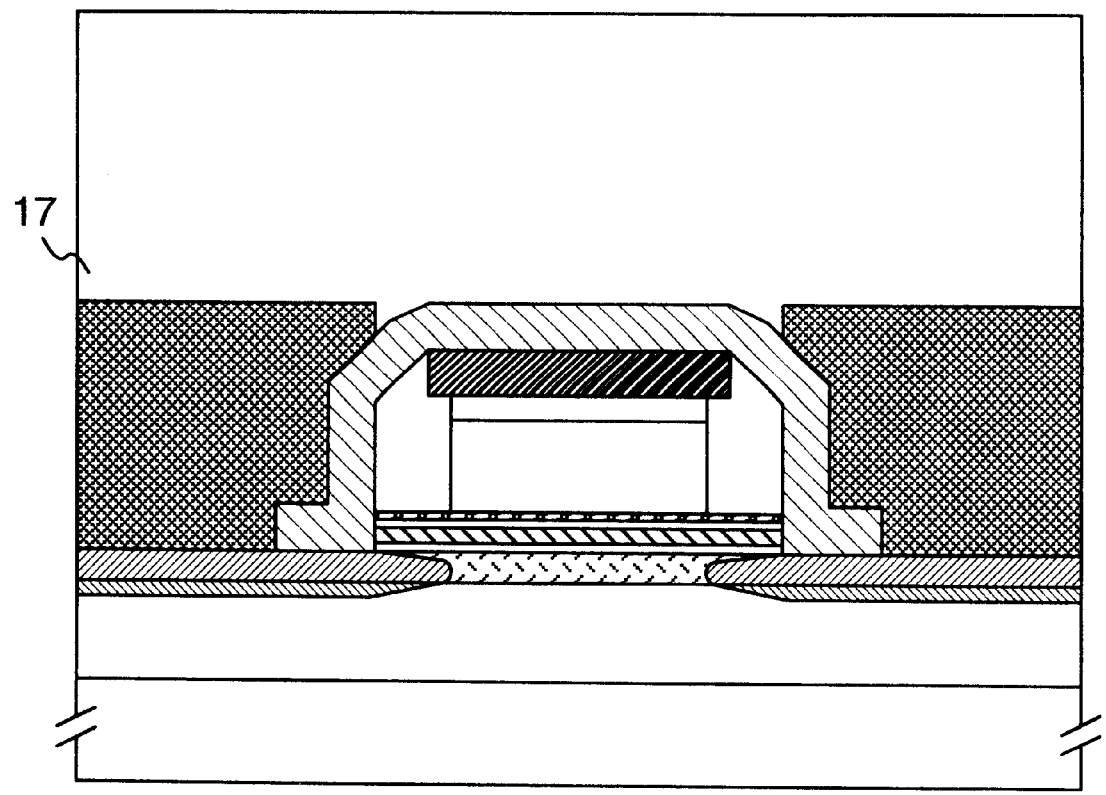
FIG. 6 shows production steps of a collector top HBT used in the semiconductor device of the first and second examples of the present invention.

Thereafter, a base electrode 11 [Pt (20 nm)/Ti (50 nm)/Pt (50 nm)/Au (200 nm)/Mo (20 nm)] was formed by a lift-off method using electron beam vapor deposition, and a photo resist pattern 16 with a height equal to the collector mesa including the collector electrode was produced at a space of 0.6 µm from the collector mesa by photolithography (FIG. 5). Then, the whole wafer was planarized with a photo resist 17 of 2 µm in film thickness (FIG. 6).

Figure 7:
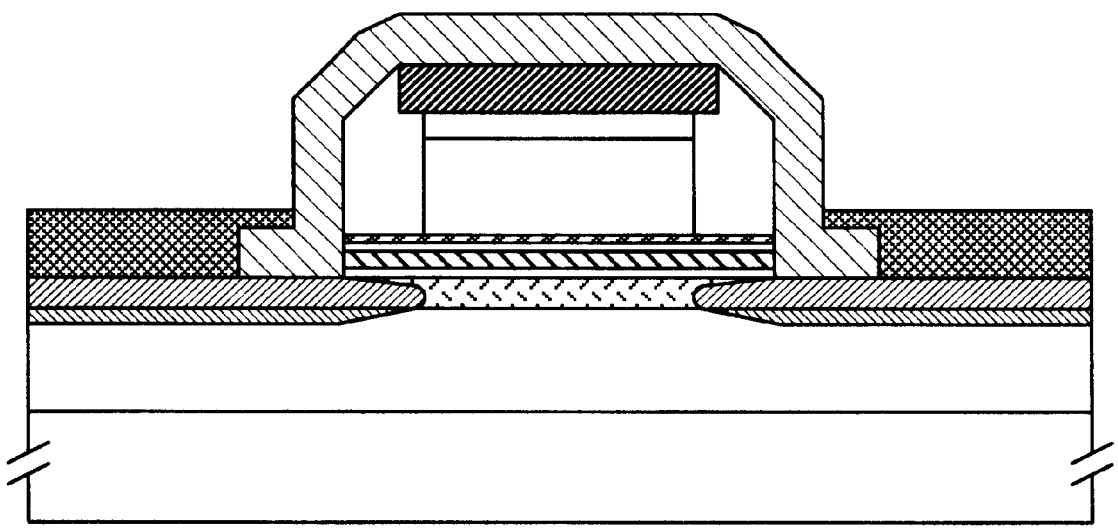
FIG. 7 shows production steps of a collector top HBT used in the semiconductor device of the first and second examples of the present invention.
Figure 8:
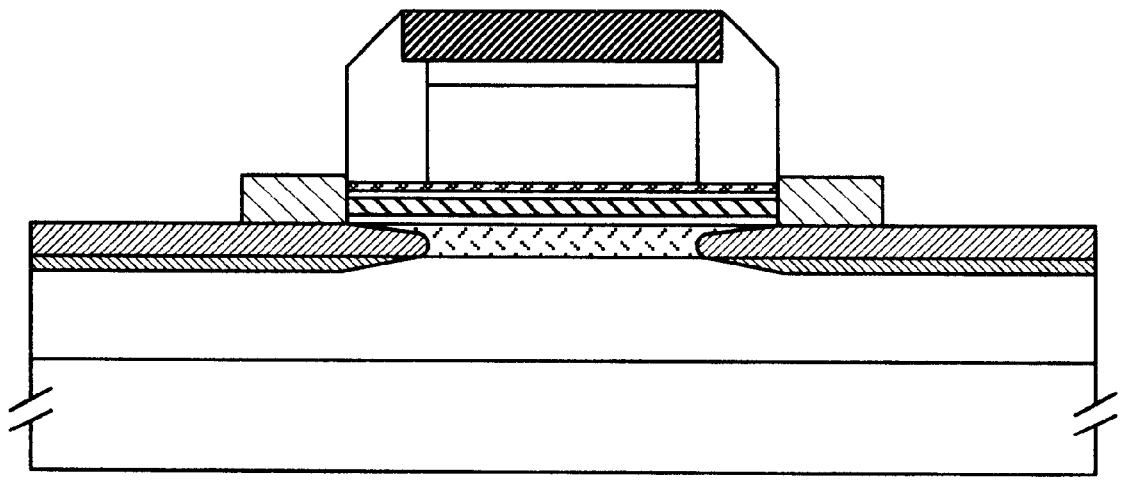
FIG. 8 shows production steps of a collector top HBT used in the semiconductor device of the first and second examples of the present invention.

Then, the photo resists 17, 16 were subjected to etching-back by dry etching using CF$_4$ and oxygen to expose the base electrode 11 deposited on the collector electrode 10 (FIG. 7). Unnecessary base electrode in the base electrode 11 was removed using ion milling, and then the photo resist was removed using plasma of a mixed gas of CF$_4$, O$_2$ and N$_2$ (FIG. 8).

Figure 9:
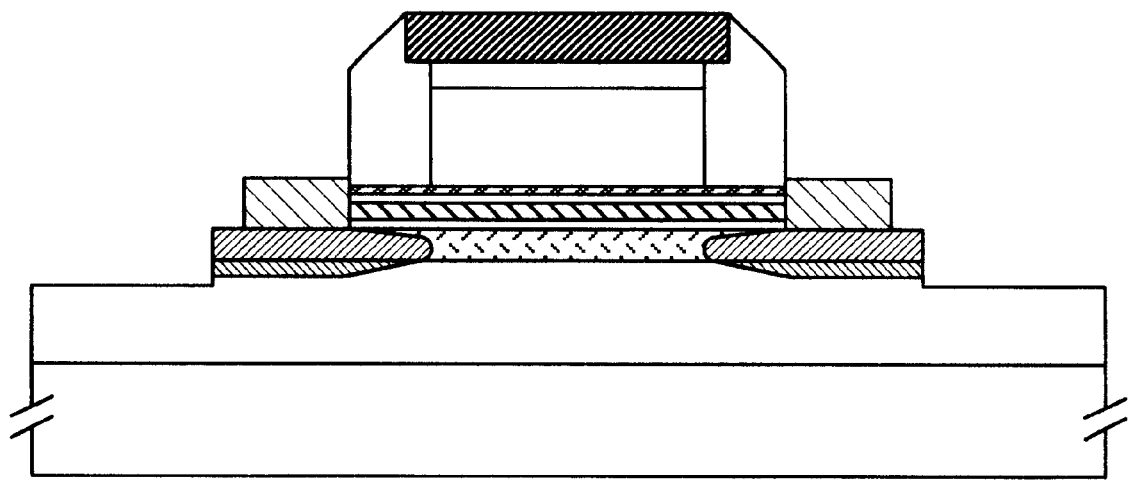
FIG. 9 shows production steps of a collector top HBT used in the semiconductor device of the first and second examples of the present invention.

Thereafter, the high resistance InGaP extrinsic emitter area 14 and the high resistance GaAs extrinsic sub-emitter area 13 were removed by photolithography and wet etching with aqueous hydrochloric acid solution and a mixed solution comprising phosphoric acid, hydrogen peroxide and water, thereby exposing the low resistance n-type GaAs sub-emitter layer 2 (FIG. 9).

Figure 10:
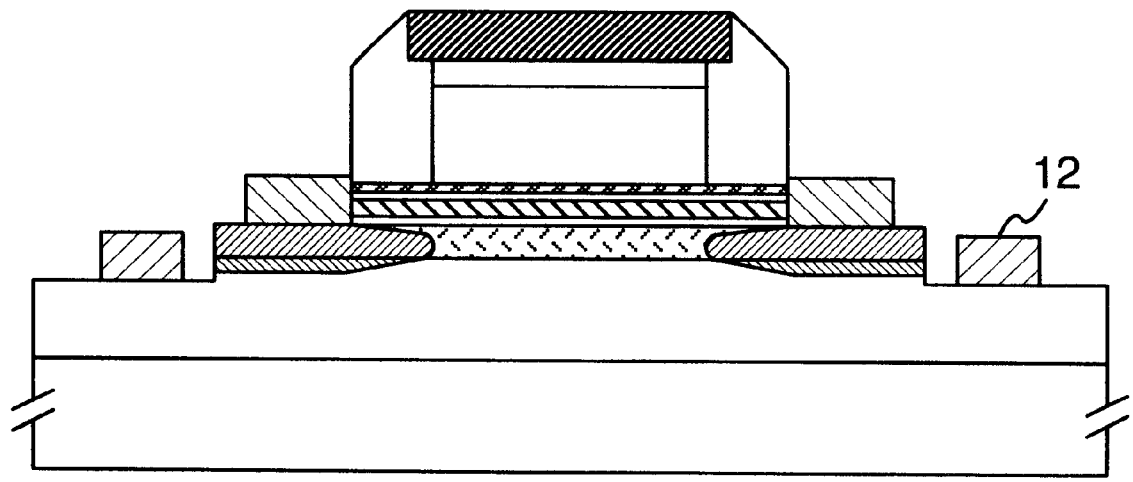
FIG. 10 shows production steps of a collector top HBT used in the semiconductor device of the first and second examples of the present invention.

Subsequently, an emitter electrode 12 comprising AuGe (film thickness 60 nm)/Ni (film thickness 10 nm)/Au (film thickness 300 nm) was formed by lift-off method and alloyed at 410° C. for 10 minutes in an nitrogen atmosphere (FIG. 10). Then, the n-type GaAs sub-emitter layer 2 was removed by photolithography and wet etching with an aqueous hydrochloric acid solution and a mixed solution comprising phosphoric acid, hydrogen peroxide and water, thereby performing isolation of elements to produce the collector top HBT shown in FIG. 1. Finally, necessary wiring was carried out for the collector electrode 10, the base electrode 11 and the emitter electrode 12 (not shown).

According to this example, the diffusion in lateral direction of crystal defects caused by the ion implantation occurs only in the n-type InGaP emitter layer 3 and the highly doped n-type GaAs sub-emitter layer 2, and the crystal defects in lateral direction does not occur in the p-type GaAs base layer 5. Therefore, the dependence of the current gain on the collector size caused by recombination of carriers in the collector top HBT base neutral area which is a problem in the prior art can be inhibited. Accordingly, in the power amplifier constructed by parallel connection of a plurality of the small collector top HBTs, the base current flowing through the base bias circuit decreases, and as a result there are effects of reducing power consumption in the base bias circuit and improving power conversion efficiency of the power amplifier. For example, in the case of GMSK (Gaussian Filtered Minimum Shift Keying) modulated wave of 880 MHz to 915 MHz in frequency, power-added efficiency at an output power of 35 dBm, at an electric source voltage of 3.5 V and a temperature of 25 was 69% in a power amplifier using the prior art collector top HBT while it was 73% in the power amplifier using the collector top HBT of the present invention, which was higher by 4% than in the prior art power amplifier.

In this example, InGaP was used for the emitter layer, but it is natural that the similar effects can be obtained using other materials such as AlGaAs as far as they are latticed-matched with the GaAs substrate 1 and are larger in forbidden band width than the base layer GaAs.

EXAMPLE 2

A collector top HBT used in the power amplifier which is the second example of the present invention will be explained using FIG. 1 as in Example 1. On a semi-insulating InP substrate 1 are present a highly doped n-type InGaAs sub-emitter layer 2 (Si concentration: $4 \times 10^{19}$ cm$^{-3}$, film thickness: 0.8 μm), an n-type InAlAs emitter layer 3 (InAs molar ratio: 0.5, Si concentration: $5 \times 10^{17}$ cm$^{-3}$, film thickness: 0.2 μm), an undoped InGaAs spacer layer 4 (film thickness: 5 nm), a p-type InGaAs base layer 5 (C concentration: $4 \times 10^{19}$ cm$^{-3}$, film thickness: 70 nm), an undoped InGaAs spacer layer 6 (film thickness: 5 nm), an n-type InAlGaAs etch stop layer 7 (composition being gradually changed, Si concentration: $3 \times 10^{17}$ cm$^{-3}$$_1$, film thickness: 20 nm), an n-type InP collector layer 8 (Si concentration: $3 \times 10^{16}$ cm$^{-3}$, film thickness: 0.8 μm), and an n-type InGaAs cap layer 9 (InAs molar ratio: 0.5, Si concentration: $1 \times 10^{19}$ cm$^{-3}$, film thickness: 0.2 μm), and a collector electrode 10 and a base electrode 11 are formed in self alignment with an SiO$_2$ side wall 15 being present between the electrodes. On the other hand, an emitter electrode 12 is formed in non-self alignment in respect to the base mesa. Here, a high resistance InAlAs extrinsic emitter area 14 and a high resistance InGaAs extrinsic sub-emitter area 13 in which boron ion is implanted are present in the transistor extrinsic area (the area other than the transistor intrinsic area just under the collector electrode 10) in the emitter layer 3 and the sub-emitter layer 2, thereby controlling the base current (flow 16 of electron in FIG. 1) flowing through the extrinsic emitter-base junction. As the ion to be implanted, there may be used any of hydrogen, helium, beryllium, carbon, nitrogen, oxygen, fluorine or neon in addition to boron to similarly form the high resistance areas 13 and 14. The current gain of the collector top HBT having a collector size of $2 \times 20$ μm$^2$ in this example was 55 as in Example 1. This value is the same as the current gain in the case of $100 \times 100$ μm$^2$ in collector size, and thus the dependence of current gain on collector size which was a problem in the prior art could be diminished.

Next, a method of the production of the collector top HBT shown in FIG. 1 will be explained referring to FIG. 2 to FIG. 10. First, the highly doped n-type InGaAs sub-emitter layer 2, the n-type InAlAs emitter layer 3, the undoped InGaAs spacer layer 4, the p-type InGaAs base layer 5, the undoped InGaAs spacer layer 6, the n-type InAlGaAs etch stop layer 7, the n-type InP collector layer 8, and the n-type InGaAs cap layer 9 were successively epitaxially grown on the semi-insulating InP substrate 1 using a metalorganic vapor phase epitaxy method or a molecular beam epitaxy method. Thereafter, WSi (Si molar ratio: 0.3, film thickness: 0.3 μm) was deposited on the whole surface of the wafer using an RF sputtering method, and the collector electrode 10 was formed by photolithography and dry etching using CF$_4$. Then, using this collector electrode 10 as a mask, the n-type InGaAs cap layer 9 and the n-type InP collector layer 8 were removed by dry etching using CH$_4$ and Cl$_2$ and with an aqueous hydrochloric acid solution. In this case, the n-type InAlGaAs etch stop layer 7 was not etched by the wet etching with the aqueous hydrochloric acid solution, and the surface of the n-type InAlGaAs etch stop layer 7 was exposed (FIG. 2).

Thereafter, an SiO$_2$ film (film thickness: 400 μm) was deposited at 390° C. using a thermal decomposition chemical vapor phase deposition method, and the SiO$_2$ side wall 15 was processed by dry etching using C$_2$F$_6$ and CHF$_3$. Subsequently, the n-type InAlGaAs etch stop layer 7, the undoped InGaAs spacer layer 6 and the p-type InGaAs base layer 5 were with a mixed solution comprising phosphoric acid, hydrogen peroxide and water using the collector electrode 10 and the SiO$_2$ side wall 15 as masks, thereby to expose the surface of the n-type InAlAs emitter layer 3 (FIG. 3). Then, boron ions 51 were implanted into the whole surface at room temperature under the conditions of an acceleration energy of 50 keV, an angle of incidence of 0°, and a dose of $2 \times 10^{12}$ cm$^{-2}$. In this case, the crystal defects formed by the ion implantation diffused in lateral direction, and the high resistance InAlAs extrinsic emitter area 14 and the high resistance InGaAs extrinsic sub-emitter area 13 expanded in lateral direction. This expansion width further expanded at the subsequent heating step of the production steps, and after completion of the production steps, the expansion width was estimated to be about 0.3 μm to 0.5 μm from the dependence of the collector current on the collector mesa size.

Thereafter, a base electrode 11 [Pt (20 nm)/Ti (50 nm)/Pt (50 nm)/Au (200 nm)/Mo (20 nm)] was formed by a lift-off method using electron beam vapor deposition, and a photo resist pattern 16 with a height equal to the collector mesa including the collector electrode was produced at a space of 0.6 μm from the collector mesa by photolithography (FIG. 5). Then, the whole wafer was planarized with a photo resist 17 of 2 μm in film thickness (FIG. 6).

Then, the photo resists 17, 16 were subjected to etching-back by dry etching using CF$_4$ and oxygen to expose the base electrode 11 deposited on the collector electrode 10 (FIG. 7). Unnecessary base electrode in the base electrode 11 was removed using ion milling, and then the photo resist was removed using plasma of a mixed gas of CF$_4$, O$_2$ and N$_2$ (FIG. 8).

Thereafter, the high resistance InAlAs extrinsic emitter area 14 and the high resistance InGaAs extrinsic sub-emitter area 13 were removed by photolithography and wet etching with an aqueous hydrochloric acid solution and a mixed solution comprising phosphoric acid, hydrogen peroxide and water, thereby exposing the low resistance n-type InGaAs sub-emitter layer 2 (FIG. 9).

Subsequently, an emitter electrode 12 comprising Au (film thickness 200 nm)/Pt (film thickness 50 nm)/Ti (film thickness 50 nm) was formed by lift-off method (FIG. 10). Then, the n-type InGaAs sub-emitter layer 2 was removed by photolithography and wet etching with a mixed solution comprising phosphoric acid, hydrogen peroxide and water, thereby performing isolation of elements to produce the collector top HBT shown in FIG. 1. Finally, necessary wiring was carried out for the collector electrode 10, the base electrode 11 and the emitter electrode 12 (not shown).

According to this example, the diffusion in lateral direction of crystal defects caused by the ion implantation occurs only in the n-type InAlAs emitter layer 3 and the highly doped n-type InGaAs sub-emitter layer 2, and the crystal defects do not diffuse in lateral direction in the p-type InGaAs base layer 5. Therefore, the dependence of the current gain on the collector size caused by recombination of carriers in the collector top HBT base neutral area which was a problem in the prior art can be inhibited. Accordingly, in the power amplifier constructed by parallel connection of a plurality of the fine collector top HBT of this example, the base current flowing through the base bias circuit is diminished, and as a result there are effects of reducing the power consumption in the base bias circuit and improving the power conversion efficiency of the power amplifier. For example, in the case of GMSK (Gaussian Filtered Minimum Shift Keying) modulated wave of 880 MHz to 915 MHz in frequency, power-added efficiency at an output power of 35 dBm, at an electric source voltage of 3.5 V and a temperature of 25° C. was 71% in a power amplifier using the prior art collector top HBT while it was 75% in the power amplifier using the collector top HBT of the present invention, which was higher by 4% than in the prior art power amplifier.

In this example, InAlAs was used for the emitter layer, but it is natural that the similar effects can be obtained using other materials such as InAlGaAs containing Ga as far as they are lattice-matched with the InP substrate 1 and are larger in forbidden band width than the base layer InGaAs.

EXAMPLE 3

Figure 11:
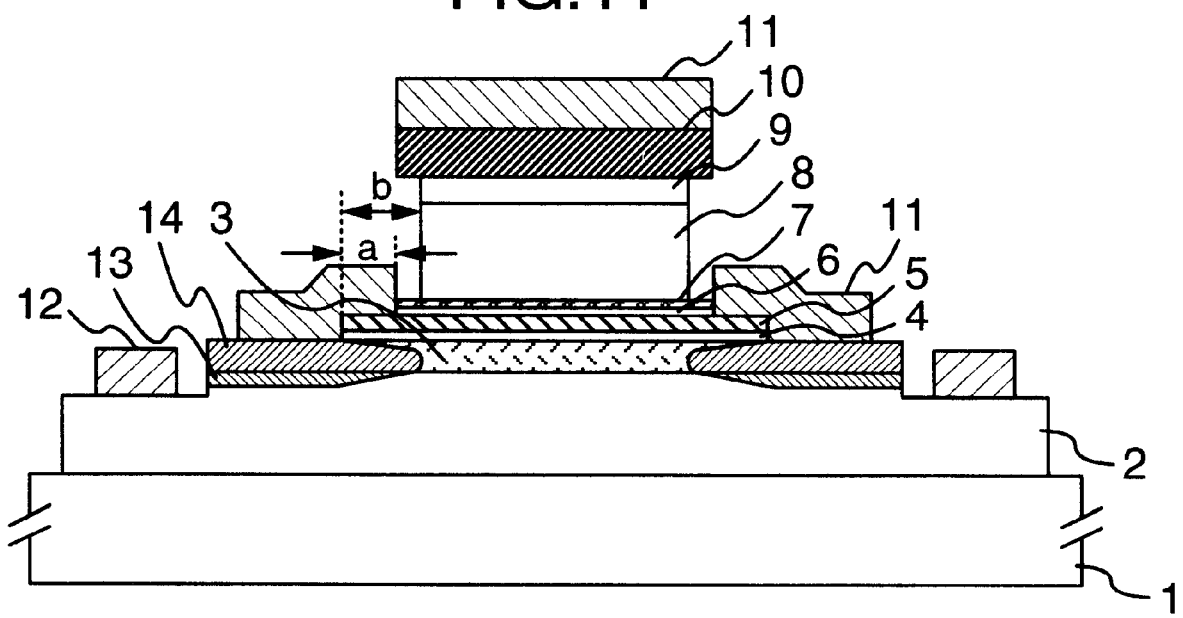
FIG. 11 shows production steps of a collector top HBT used in the semiconductor device of the third and fourth examples of the present invention.
Figure 12:
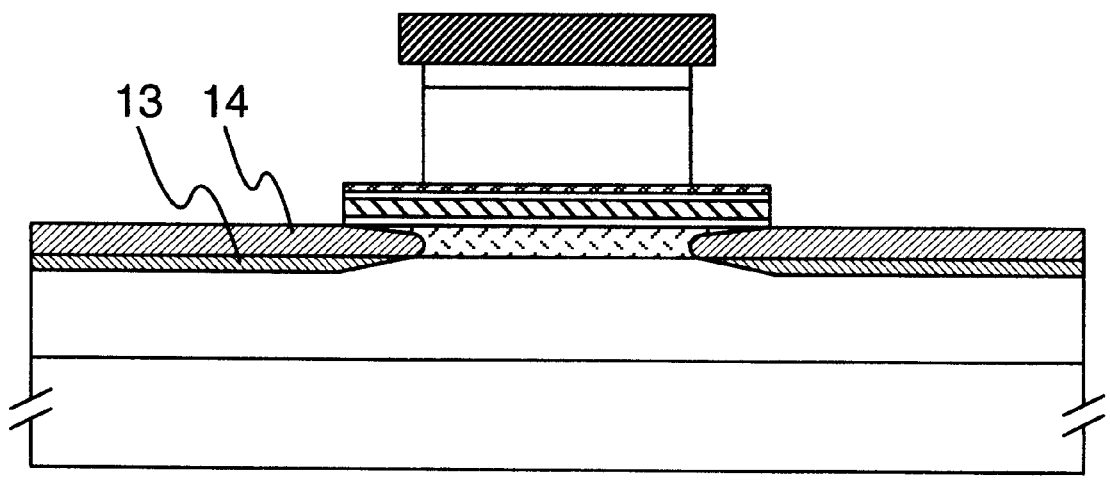
FIG. 12 shows production steps of a collector top HBT used in the semiconductor device of the third and fourth examples of the present invention.
Figure 13:
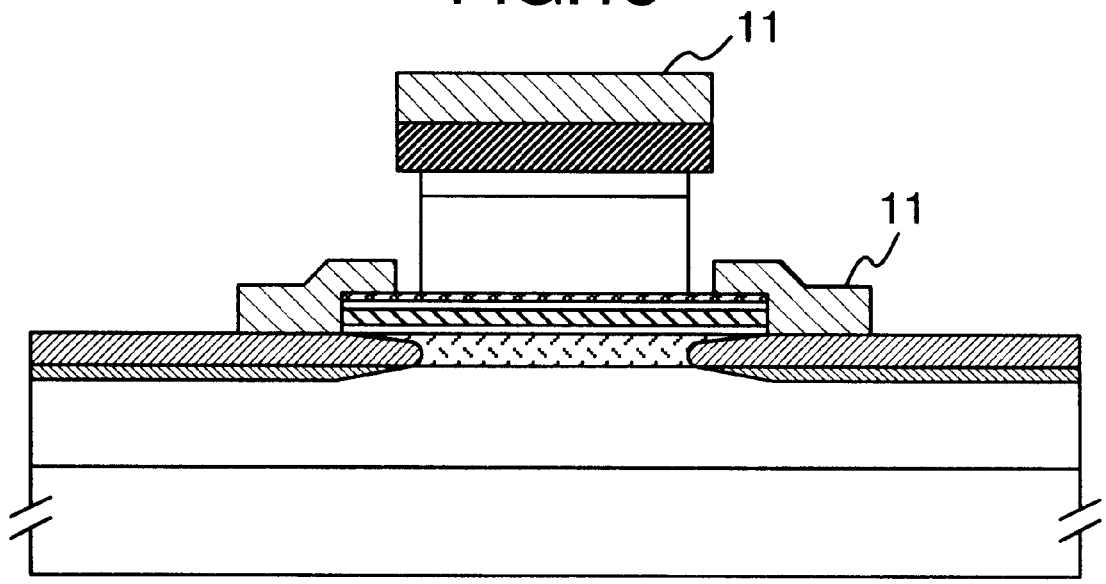
FIG. 13 shows production steps of a collector top HBT used in the semiconductor device of the third and fourth examples of the present invention.

FIG. 11 is a longitudinal sectional view of a collector top HBT used in the power amplifier which is he third example of the present invention. On a semi-insulating GaAs substrate 1 are present a highly doped n-type GaAs sub-emitter layer 2 (Si concentration: $5\times10^{18}$ cm$^{-3}$ film thickness: 0.8 μm), an n-type InGaP emitter layer 3 (InP molar ratio: 0.5, Si concentration: $5\times10^{17}$ cm$^{-3}$, film thickness: 0.2 μm), an undoped GaAs spacer layer 4 (film thickness: 5 nm), a p-type GaAs base layer 5 (C concentration: $3\times10^{19}$ cm$^{-3}$, film thickness: 70 nm), an undoped GaAs spacer layer 6 (film thickness: 20 nm), an n-type InGaP etch stop layer 7 (InP molar ratio: 0.5, Si concentration: $3\times10^{17}$ cm$^{-3}$, film thickness: 5 nm), an n-type GaAs collector layer 8 (Si concentration: $3\times10^{16}$ cm$^{-3}$, film thickness: 0.8 μm), and an n-type InGaAs cap layer 9 (InAs molar ratio: 0.5, Si concentration: $1\times10^{19}$ cm$^{-3}$, film thickness: 0.2 μm). No SiO$_2$ side wall is present, being different from Example 1. A base electrode 11 is formed in self alignment to a collector electrode 10 utilizing the undercut of the collector mesa. As in Example 1, an emitter electrode 12 is formed in non-self alignment to the base mesa, and a high resistance InGaP extrinsic emitter area 14 and a high resistance GaAs extrinsic sub-emitter area 13 in which boron ion is implanted are present in the transistor extrinsic area (the area other than the transistor intrinsic area just under the collector electrode 10) in the emitter layer 3 and the sub-emitter layer 2, thereby controlling the base current (flow 27 of electron in FIG. 1) flowing through the extrinsic emitter-base junction. As the ion to be implanted, there may be used any of hydrogen, helium, beryllium, carbon, nitrogen, oxygen, fluorine or neon in addition to boron to similarly form the high resistance areas 13 and 14. Being different from Example 1, the base electrode 11 is formed in contact with not only the high resistance InGaP extrinsic emitter area 14, but also the upper surface of the p-type GaAs base layer 5. Moreover, the width a at which the base electrode 11 contacts with the upper surface of the base layer 5 is not more than 0.3 μm, and the distance b between the collector mesa end and the side face of the base layer is not more than 0.5 μm.

The current gain of the collector top HBT having a collector size of $2\times20$ μm$^2$ in this example was 55. That is, not only the dependence of current gain on collector size could be inhibited as in Example 1, but also the base resistance in the collector top HBT having a collector size of $2\times20$ μm$^2$ was 10Ω, namely, lower than 40Ω in Example 1. Even if the width a exceeds 0.3 μm. the base resistance does not decrease in the range of acceptor concentration of $(1-6)\times10^{19}$ cm$^{-3}$ which is ordinarily used, and thus the width a can be 0.3 μm or less. The maximum value of b is specified depending on the distance in which the crystal defects formed during the ion implantation diffuse in lateral direction in the subsequent device production steps, and if b is too great, the emitter-base junction area is larger than the base-collector junction area and the current gain is less than 1 and this is not suitable for practical use. The distance b must be not more than 0.5 μm, considering that the maximum temperature usually employed in the process of production of GaAs-based compound semiconductors is about 410° C., and the maximum retention time at that temperature is about 30 minutes.

Next, a method of the production of the collector top HBT shown in FIG. 11 will be explained referring to FIG. 12 to FIG. 16. The steps from the formation of collector electrode to the formation of a high resistance InGaP extrinsic emitter area 14 and a high resistance GaAs extrinsic sub-emitter area 13 are the same as those shown in FIG. 2 to FIG. 4 of Example 1.

Figure 14:
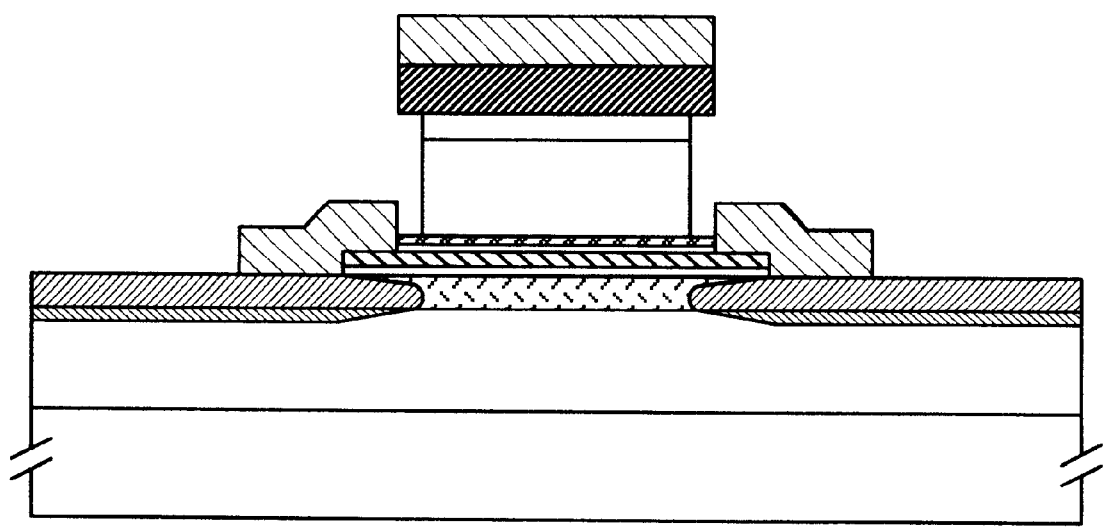
FIG. 14 shows production steps of a collector top HBT used in the semiconductor device of the third and fourth examples of the present invention.

After the ion implantation step, the SiO$_2$ side wall 15 which was used as a part of mask in the ion implantation was removed by buffer hydrofluoric acid (FIG. 12), and a base electrode 11 was formed by lift-off method. In this case, metals for the base electrode, Pt (20 nm)/Ti (50 nm)/Pt (50 nm)/Au (200 nm)/Mo (20 nm) were formed by a directional electron beam vapor deposition, and as a result, the portion deposited on the collector electrode 11 (WSi, film thickness 0.3 μm) and the portion deposited on the surface of the n-type InGaP etch stop layer 7 and the high resistance InGaP extrinsic emitter area 14 were separated and the collector electrode 10 and the base electrode 11 were formed in self alignment (FIG. 13), followed by alloying at 410° C. for 10 minutes in a nitrogen atmosphere and sintering Pt through the n-type InGaP etch stop layer 7 and the undoped GaAs spacer layer 6 to allow the base electrode to directly contact with the base layer 5 (FIG. 14).

Figure 15:
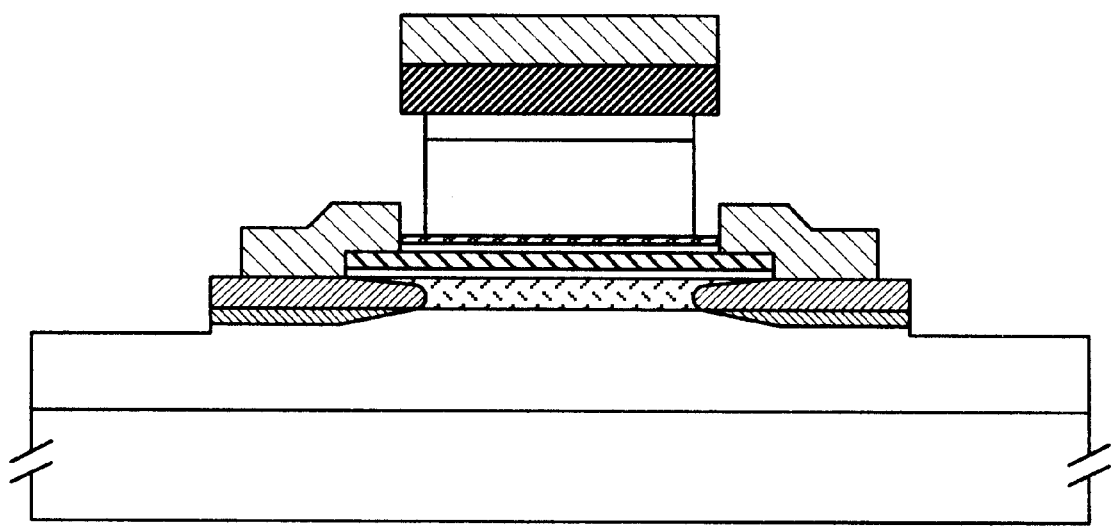
FIG. 15 shows production steps of a collector top HBT used in the semiconductor device of the third and fourth examples of the present invention.

Thereafter, the high resistance InGaP extrinsic emitter area 14 and the high resistance GaAs extrinsic sub-emitter area 13 were removed by photolithography and wet etching with an aqueous hydrochloric acid solution and a mixed solution comprising phosphoric acid, hydrogen peroxide and water to expose the low resistance n-type GaAs sub-emitter layer 2 (FIG. 15).

Figure 16:
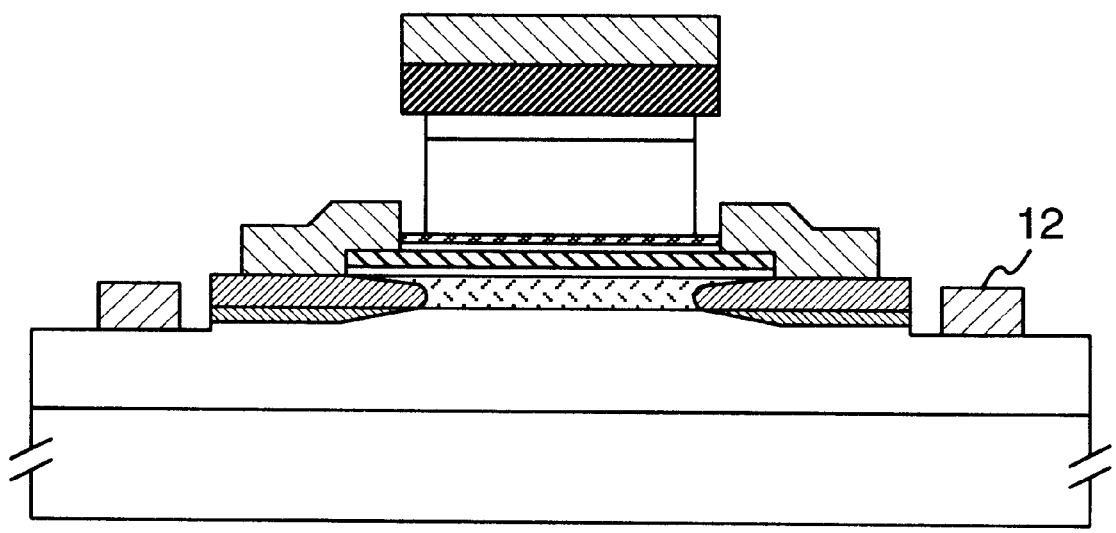
FIG. 16 shows production steps of a collector top HBT used in the semiconductor device of the third and fourth examples of the present invention.

Subsequently, an emitter electrode 12 comprising AuGe (film thickness 60 nm)/Ni (film thickness 10 nm)/Au (film thickness 300 nm) was formed by lift-off method and alloyed at 410° C. for 10 minutes in a nitrogen atmosphere (FIG. 16). Then, the n-type GaAs sub-emitter layer 2 was removed by photolithography and wet etching with a mixed solution comprising phosphoric acid, hydrogen peroxide and water, thereby performing isolation of elements to produce the collector top HBT shown in FIG. 11. Finally, necessary wiring was carried out for the collector electrode 10, the base electrode 11 and the emitter electrode 12 (not shown).

According to this example, since the base electrode can be formed on the surface of the low resistance extrinsic base layer in which ion implantation is not carried out, a collector top HBT low in base resistance can be realized. Accordingly, in the power amplifier constructed by parallel connection of a plurality of the fine collector top HBTs, there is an effect of the power gain being improved in addition to the effects mentioned in Example 1. For example, for GMSK modulated wave of 880 MHz to 915 MHz in frequency, power gain at an output power of 35 dBm, at an electric source voltage of 3.5 V and a temperature of 25° C. was 13 dB in a power amplifier using the prior art collector top HBT while it was 16 dB in the power amplifier using the collector top HBT of the present invention, which was higher by 3 dB than in the prior art power amplifier.

EXAMPLE 4

A collector top HBT used in the power amplifier which is the fourth example of the present invention will be explained using FIG. 11 as in Example 3. As in Example 2, on a semi-insulating InP substrate 1 are present a highly doped n-type InGaAs sub-emitter layer 2 (Si concentration: $4\times10^{19}$ cm$^{-3}$, film thickness: 0.8 μm), an n-type InAlAs emitter layer 3 (InAs molar ratio: 0.5, Si concentration: $5\times10^{17}$ cm$^{-3}$, film thickness: 0.2 μm), an undoped InGaAs spacer layer 4 (film thickness: 5 nm), a p-type InGaAs base layer 5 (C concentration: $3\times10^{19}$ cm$^{-3}$, film thickness: 70 nm), an undoped InGaAs spacer layer 6 (film thickness: 5 nm), an n-type InAlGaAs etch stop layer 7 (composition being gradually changed, Si concentration: $3\times10^{17}$ cm$^{-3}$, film thickness: 5 nm), an n-type InP collector layer 8 (Si concentration: $3\times10^{16}$ cm$^{-3}$, film thickness: 0.8 μm), and an n-type InGaAs cap layer 9 (InAs molar ratio: 0.5, Si concentration: $1\times10^{19}$ cm$^{-3}$, film thickness: 0.2 μm). No SiO$_2$ side wall is present, being different from Example 2. A base electrode 11 is formed in self alignment to a collector electrode 10 utilizing the undercut of the collector mesa. As in Example 2, an emitter electrode 12 is formed in non-self alignment to the base mesa, and a high resistance InAlAs extrinsic emitter area 14 and a high resistance InGaAs extrinsic sub-emitter area 13 in which boron ion is implanted are present in the transistor extrinsic area (the area other than the transistor intrinsic area just under the collector electrode 10) in the emitter layer 3 and the sub-emitter layer 2, thereby controlling the base current (flow 16 of electron in FIG. 1) flowing through the extrinsic emitter-base junction. As the ion to be implanted, in addition to boron, there may be used any of hydrogen, helium, beryllium, carbon, nitrogen, oxygen, fluorine or neon to similarly form the high resistance areas 13 and 14. Being different from Example 2, the base electrode 11 is formed in contact with not only the high resistance InAlAs extrinsic emitter area 14, but also the upper surface of the p-type InGaAs base layer 5. Moreover, the width a at which the base electrode 11 contacts with the upper surface of the base layer 5 is not more than 0.3 μm, and the distance b between the collector mesa end and the side face of the base layer is not more than 0.5 μm.

The current gain of the collector top HBT having a collector size of $2\times20$ μm$^2$ in this example was 55. That is, not only the dependence of current gain on collector size could be reduced as in Example 1, but also the base resistance in the collector top HBT having a collector size of $2\times20$ μm$^2$ was 10Ω, namely, lower than 40Ω in Example 1. Even if the width a exceeds 0.3 μm, the base resistance does not decrease in the range of acceptor concentration of $(1-6)\times10^{19}$ cm$^{-3}$ which is ordinarily used for the base layer of HBT and thus the width a can be 0.3 μm or less. The maximum value of b is specified depending on the distance in which the crystal defects formed during the ion implantation diffuse in lateral direction in the subsequent device production steps, and if b is too great, the emitter-base junction area is larger than the base-collector junction area and the current gain is less than 1 and this is not suitable for practical use. The distance b must be not more than 0.5 μm, taking into consideration the facts that the maximum temperature usually employed in the process of production of GaAs-based compound semiconductors is about 410° C., and the maximum retention time at that temperature is about 30 minutes.

Next, a method of the production of the collector top HBT shown in FIG. 11 will be explained referring to FIG. 12 to FIG. 16. The steps from the formation of the collector electrode to the formation of the high resistance InAlAs extrinsic emitter area 14 and the high resistance InGaAs extrinsic sub-emitter area 13 are the same as those shown in FIG. 2 to FIG. 4 of Example 2.

After the ion implantation step, the SiO$_2$ side wall 15 which was used as a part of mask in the ion implantation was removed by buffer hydrofluoric acid (FIG. 12), and a base electrode 11 was formed by lift-off method. In this case, metals for the base electrode, Pt (20 nm)/Ti (50 nm)/Pt (50 nm)/Au (200 nm)/Mo (20 nm) were formed by a directional electron beam vapor deposition, and as a result, the portion deposited on the collector electrode 11 (WSi, film thickness 0.3 μm) and the portions deposited on the surface of the n-type InAlGaAs etch stop layer 7 and the high resistance InGaP extrinsic emitter area 14 were separated and the collector electrode 10 and the base electrode 11 were formed in self alignment (FIG. 13), followed by alloying at 410° C. for 10 minutes in a nitrogen atmosphere and sintering Pt through the n-type InAlGaAs etch stop layer 7 and the undoped InGaAs spacer layer 6 to allow the base electrode to directly contact with the base layer 5 (FIG. 14).

Thereafter, the high resistance InAlAs extrinsic emitter area 14 and the high resistance InGaAs extrinsic sub-emitter area 13 were removed by photolithography and wet etching with a mixed solution comprising phosphoric acid, hydrogen peroxide and water to expose the low resistance n-type InGaAs sub-emitter layer 2 (FIG. 15).

Subsequently, an emitter electrode 12 comprising Ti (50 nm)/Au (200 nm) was formed by lift-off method (FIG. 16). Then, the n-type InGaAs subemitter layer 2 was removed by photolithography and wet etching with a mixed solution comprising phosphoric acid, hydrogen peroxide and water, thereby performing isolation of elements to produce the collector top HBT shown in FIG. 11. Finally, necessary wiring was carried out for the collector electrode 10, the base electrode 11 and the emitter electrode 12 (not shown).

According to this example, since the base electrode can be formed on the surface of the low resistance outer base layer in which ion is not implanted, a collector top HBT low in base resistance can be realized. Accordingly, in the power amplifier constructed by parallel connection of a plurality of the fine collector top HBT, there is an effect of the power gain being improved in addition to the effects mentioned in Example 1. For example, for GMSK modulated wave of 880 MHz to 915 MHz in frequency, power gain at an output power of 35 dBm, at an electric source voltage of 3.5 V and a temperature of 25° C. was 13 dB in a power amplifier using the prior art collector top HBT while it was 16 dB in the power amplifier using the collector top HBT of the present invention, which was higher by 3 dB than in the prior art power amplifier.

EXAMPLE 5

Figure 17:
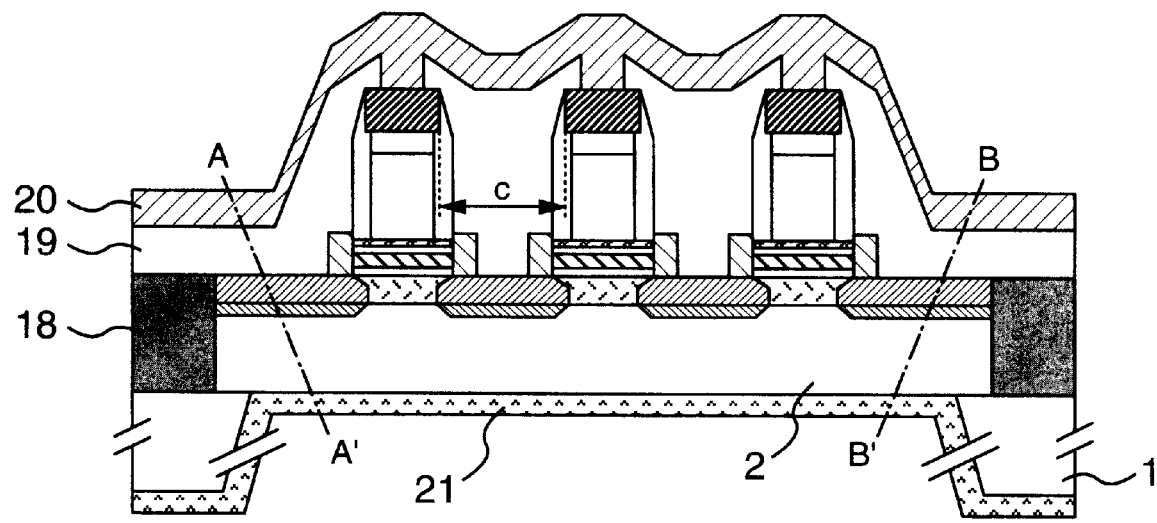
FIG. 17 is a longitudinal sectional view showing the structure of a collector top HBT used in the semiconductor device of the third and fourth examples of the present invention.

FIG. 17 is a longitudinal sectional view of finger row of collector top HBT used in the power amplifier which is the fifth example of the present invention. The collector top HBT shown in Example 1 was used for each transistor. Wet etching was used for element isolation in Example 1, but in this example a high resistance GaAs element isolation region was formed using implantation of ion such as boron for the purpose of diminishing large level-difference of sample surface. Wiring 20 is a collector wiring for output which connects the respective collector electrodes. The space c between the collector fingers is not less than 2 μm and not more than 10 μm, and the feature of this example is that the emitter electrode 21 is formed on the side of the semi-insulating GaAs substrate 1 which is opposite to the side on which collector electrode 10 and base electrode 11 are formed.

The structure of FIG. 17 was formed in the following manner. After formation of the element isolation region 18, the semi-insulating GaAs substrate 1 of 600 μm in film thickness was made thinner to 80 μm by mechanical abrasion, a heat-radiation hole pattern on the back side of the semi-insulating GaAs substrate 1 just under the transistor was formed by photolithography and dry etching using $SF_6$ and $SiCl_4$ and wet etching using a mixed solution comprising sulfuric acid, hydrogen peroxide and water in conformity with the surface side pattern of the semi-insulating GaAs substrate 1 using a contact aligner for two-side conformation. Then, an alloy electrode on back side of the emitter which comprised AuGe (film thickness 60 nm)/Ni (film thickness 10 nm)/Au (film thickness 4 μm) was formed on the whole back side of the thinned GaAs substrate 1, followed by alloying at 350° C. for 30 minutes in a nitrogen atmosphere.

According to this example, since heat generated at the operation of the collector top HBT can be removed not only through collector wiring metal 20 on the surface side of the GaAs substrate 1, but also through the emitter electrode 21 on the back side of the GaAs substrate 1, thermal runaway can be avoided and the distance c between the collector fingers can be shortened, and, as a result, the value c which must hitherto be 20 μm or more can be not more than 10 μm and the area of semiconductor chip including collector top HBT can be reduced to about half the area in the prior art. Thus, in this example, there is an effect to realize a power amplifier of low cost.

In this example, 2 μm was set as the lower limit of c in order to avoid the base electrode of about 1 μm in width from contacting with the adjacent collector mesas. In this example, the collector top HBT mentioned in Example 1 was used, but the collector top HBT mentioned in Example 2 can be used to obtain the similar effects.

EXAMPLE 6

Figure 18:
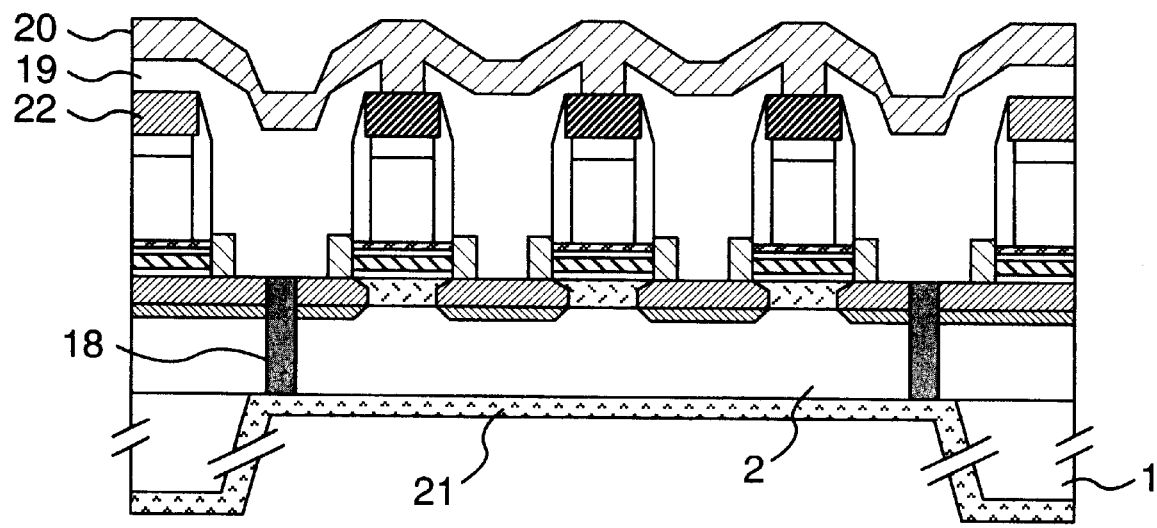
FIG. 18 is a longitudinal sectional view of showing the structure of a collector top HBT used in the semiconductor device of the sixth example of the present invention.
Figure 19:
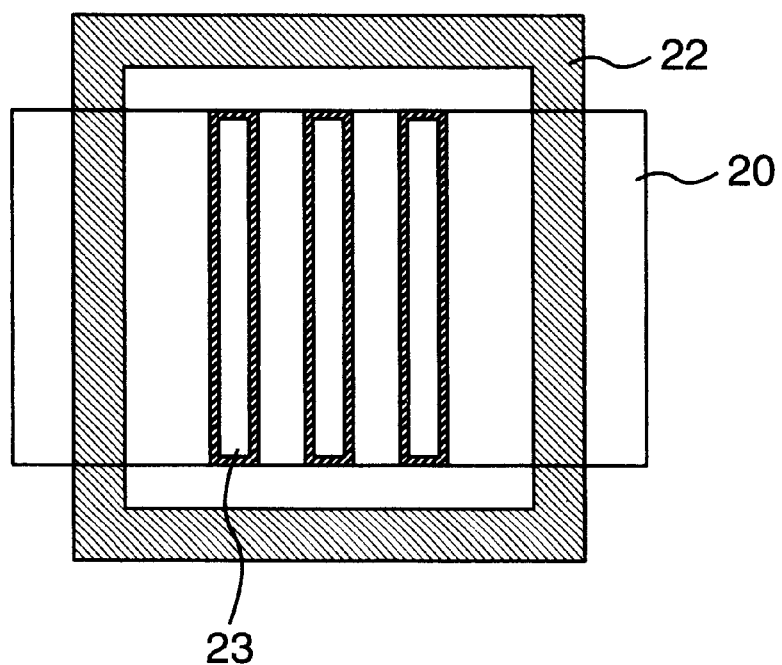
FIG. 19 is a plan view showing the structure of a collector top HBT used in the semiconductor device of the sixth example of the present invention.
Figure 20:
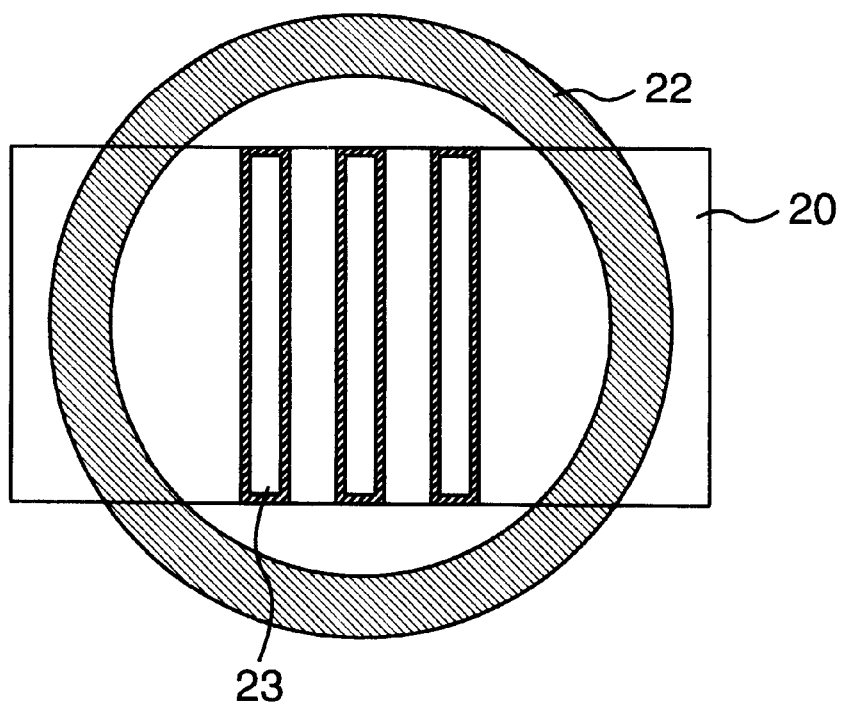
FIG. 20 is a plan view showing the structure of a collector top HBT used in the semiconductor device of the sixth example of the present invention.

FIG. 18 is a longitudinal sectional view of finger row of collector top HBT used in the power amplifier which is the sixth example of the present invention. The collector top HBT shown in Example 3 was used for each transistor. In Example 3, the radiating effect from just under the respective transistors was superior, but there was a problem that mechanical breakage occurred in the area thin in total film thickness as shown by A–A', B–B' in FIG. 17 in cutting out of the collector top HBT by a scriber after the formation of the alloy electrode on the back side of emitter, causing reduction of yield in the production of collector top HBT chip. The feature of this example is that a plurality of collector fingers are disposed in the area inside a rectangular or circular doughnut-type dummy collector electrode which is electrically insulated from the collector fingers. According to this example, owing to the presence of the dummy collector electrode structure, there are no thin film areas such as of A–A', B–B' in FIG. 17 which are mechanically weak, and hence there is an effect of being able to realize a power amplifier high in production yield and superior in reliability. FIG. 17 is shown based on the structure of the collector top HBT described in Example 1, but the structures of the collector top HBT described in Examples 2–4 can provide similar results and effects. FIG. 19 shows a plan view in the case of using a rectangular dummy collector and FIG. 20 shows a plan view in the case of using a circular dummy collector. In collector mesa for operation as a transistor, there are formed collector contact holes 23 for electrical connection of the collector electrode 20 and the collector wiring metal 20 while no collector holes are formed in the dummy collector electrode 22. An extrinsic base collector capacitance generates between the collector wiring metal 20 and the dummy collector electrode 22, but, for example, in the case of collector fingers of $2\times20$ $\mu m^2$, if six or more fingers are disposed per a doughnut-type dummy collector electrode, the extrinsic base collector capacitance is less than $\frac{1}{10}$ of intrinsic base collector capacitance of transistor and can be ignored, and thus there is no practical problem for application of the collector top HBT to the power amplifier shown in this example. As for the shape of the doughnut-type dummy collector electrode, circular shape has a merit of higher strength than rectangular shape while the rectangular shape is more suitable for increasing the number of the collector fingers in the doughnut-type dummy collector electrode. Therefore, when the production yield of the collector top HBT chip should have preference, the circular doughnut-type dummy collector may be selected, and when reduction of the area of the collector top HBT chip should have preference, the rectangular doughnut-type dummy collector may be selected. As a result of experimental investigation on mechanical strength of the rectangular doughnut-type dummy collector electrode structure, it was found that the number of collector fingers which could be disposed in one rectangular doughnut-type dummy collector electrode was 16 in maximum in the case of the collector size being $2\times20$ $\mu m^2$. For semiconductor devices which need more than 16 collector fingers, there may be disposed a plurality of rectangular doughnut-type dummy collector electrode structures in which collector fingers are disposed. In this case, from the point of mechanical strength, the interval between the rectangular doughnut-type dummy collector electrodes is preferably about the maximum thickness (80 μm in this example) or more of the GaAs substrate.

EXAMPLE 7

Figure 21:
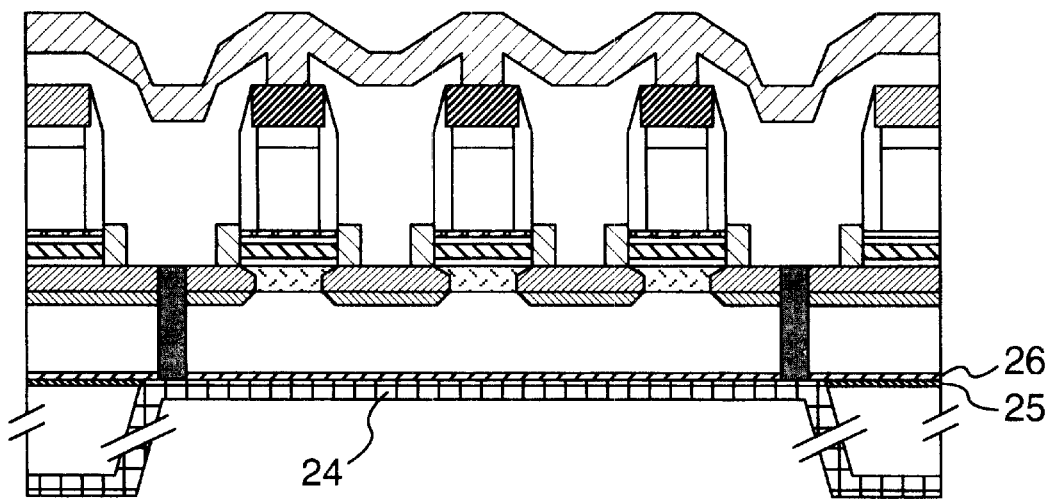
FIG. 21 is a longitudinal sectional view showing the structure of a collector top HBT used in the semiconductor device of the seventh example of the present invention.

FIG. 21 is a longitudinal sectional view of finger row of collector top HBT used in the power amplifier which is the seventh example of the present invention. The collector top HBT (FIG. 18) shown in Example 6 was used for each transistor. In FIG. 18, the back-side emitter electrode formed on the GaAs substrate 1 was an alloy electrode containing AuGe and had a high specific contact resistance with the highly doped n-type GaAs sub-emitter layer 2 of $(1-3)\times10^{-6}$ $\Omega cm^2$. This value is not so high as causing practical problem, but there is a problem of less reproducibility. As shown in FIG. 21, in this example, a highly doped n-type $In_{0.2}Ga_{0.8}As_{0.95}N_{0.02}$ emitter contact layer 26 (Si concentration: $2\times10^{19}$ $cm^{-3}$, film thickness 50 nm) on the back side of the substrate was provided between the highly doped n-type GaAs sub-emitter layer 2 and the GaAs substrate 1, and the emitter electrode formed on the GaAs substrate 1 was a non-alloyed electrode 24 having the structure Ti (film thickness) 50 nm)/Pt (film thickness 50 nm)/Au (film thickness 4 μm).

In FIG. 21, an n-type InGaP layer 25 (InP molar ratio: 0.5, Si concentration: $2 \times 10^{18}$ cm$^{-3}$, film thickness 60 nm) as an etch stop layer is present between the highly doped n-type InGaAs emitter contact layer 26 on the back side of the substrate and the GaAs substrate 1 in the area of the GaAs substrate 1 other than the heat-radiation hole just under the transistor. This layer is provided for easy formation of heat-radiation holes in the production process and for improvement of reproducibility, and is not an essential layer in this example.

A method of production of the structure having the etch stop layer 25 shown in FIG. 21 will be briefly explained below. As epitaxial forming layers, in those described in Examples 1–4, there are provided the highly doped n-type InGaAsN emitter contact layer 26 on the back side of the substrate and the highly doped n-type InGaP etch stop. layer 25 were interposed between the GaAs substrate 1 and the highly doped n-type GaAs sub-emitter layer 2. In the method of production of the collector top HBT, the steps are the same as in Examples 3 and 4 until the formation of the heat-radiation hole just under the transistor. In the formation of the heat-radiation hole on the back side of the substrate by dry etching using SF$_6$ and SiCl$_4$ and wet etching using a mixed solution comprising sulfuric acid, hydrogen peroxide and water, the etching was stopped at the highly doped n-type InGaP etch stop layer 25 and thus the highly doped n-type InGaP etch stop layer 25 was exposed in the heat-radiation hole. Then, the highly doped n-type InGaP etch stop layer 25 in the heat-radiation hole was removed using an aqueous hydrochloric acid solution to expose the highly doped n-type InGaAsN emitter contact layer 26 on the back side of the substrate. Then, an emitter non-alloyed electrode 24 on the back side of the substrate was formed on the whole back side of the GaAs substrate 1 by electron beam vapor deposition and Au plating.

According to this example, the specific contact resistance of the emitter electrode 24 on the back side of the substrate with the highly doped n-type InGaAsN emitter contact layer 26 decreased to $(0.8–1.2) \times 10^{-7}$ $\Omega$cm$^2$, and the reproducibility of the value was markedly improved. Thus, there is an effect to be able to realize a high efficiency power amplifier low in emitter resistance and superior in reproducibility.

The mixed crystal composition of the highly doped n-type InGaAsN layer 26 may not be as mentioned above if the proportion of In in the Group III elements is not less than 20% and the proportion of N in the Group V elements is not less than 2%. FIG. 21 is shown based on the structure of the collector top HBT described in Example 1, but the structure of the collector top HBT described in Example 2 can provide similar results and effects.

EXAMPLE 8

Figure 22:
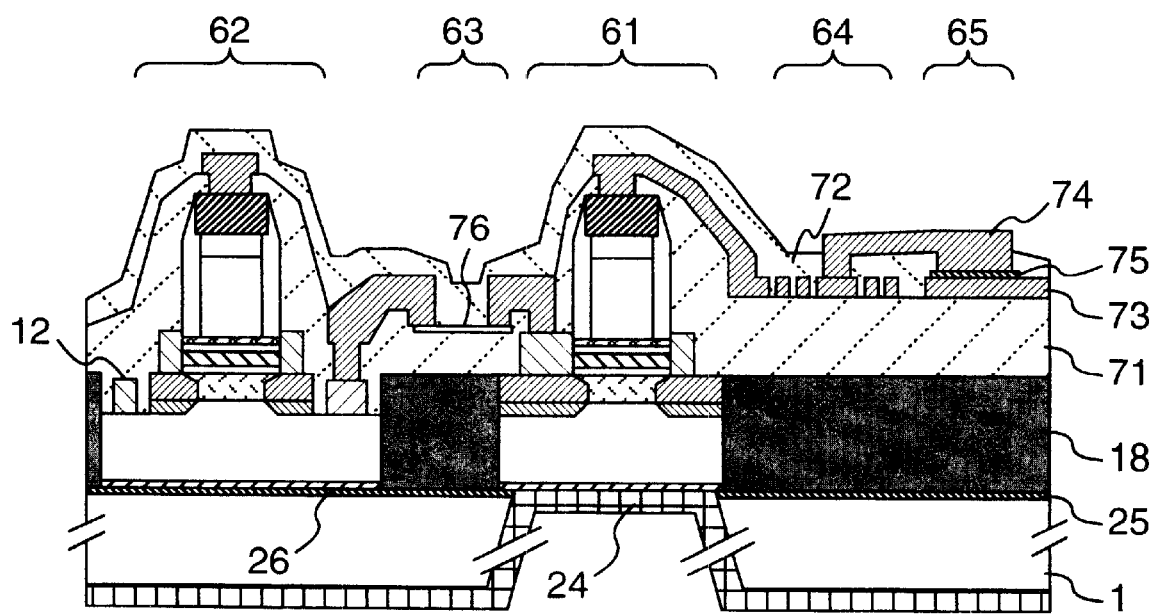
FIG. 22 is a longitudinal sectional view showing the structure of the semiconductor device of the eighth example of the present invention.

Monolithic-microwave integrated circuit for power amplifier which is the eighth example of the present invention will be explained using FIGS. 22 and 23. In this example, there was produced a monolithic-microwave integrated circuit in which the whole of circuits in the power amplifier comprising two stages (which may be three or more stages) shown in at least FIG. 23 were formed on a semi-insulating GaAs substrate 1. FIG. 22 shows a sectional structure of the portion shown by thick lines in FIG. 23.

In order to form an inductance necessary for drive-stage matching circuit to be inserted between a driver-stage HBT and output-stage HBT on a semi-insulating GaAs (or InP) substrate 1 without accompanying excess extrinsic capacitance, at least the thickness of the semi-insulating GaAs (or InP) substrate 1 must be not less than 80 $\mu$m. In this example, as shown in FIG. 22, a heat-radiation hole is provided just under the driver-stage HBT or output-stage HBT 61 to avoid thermal runaway as in the collector top HBT described in Examples 3–5. On the other hand, the emitter electrode 12 of HBT 62 for bias circuit is taken out from the surface side of the GaAs (or InP) substrate 1 and connected to resistance element 72 and the like through the first layer wiring 73. Here, WSiN or NiCr is used for resistor of the resistance element 63. The collector electrode of the driver-stage HBT or output-stage HBT 61 is connected to inductance element 64, capacitance element 65 and the like through the first layer wiring 73 and the second layer wiring 74. Here, the capacitance element has a composition of MIM (metal/insulating film/metal), and a laminate film of SiO$_2$ and Si$_3$N$_4$ is used as the insulating film, and the first layer wiring metal 73 and the second layer wiring metal 74 are used as the metal film. The HBT 62 for bias circuit, the resistance element 63, the inductance element 64 and the capacitance element 65 other than the driver-stage HBT and the output-stage HBT 61 are formed on the GaAs (or InP) substrate 1 made to a thin layer of 80 $\mu$m, and passive elements 63, 64, 65, an electrode pad (not shown) and the like other than the HBT 62 for bias circuit are formed on the high resistance area 18 in which ions such as boron are implanted.

Next, a method of production of the monolithic-microwave integrated circuit shown in FIG. 23 will be explained using FIG. 24 to FIG. 28. The method of production of the collector top HBT is the same as in Example 1. However, at this point of time, the GaAs (or InP) substrate 1 is not thinned. Coated insulating film 71 which is a layer insulating film is sintered at 350° C. for 30 minutes in a nitrogen atmosphere, and thereafter WSiN which is a resistance film is deposited on the whole surface by RF sputtering and resistor 76 for resistance element 63 was formed by photolithography and dry etching using CF$_4$ plasma (FIG. 24).

Figure 23:
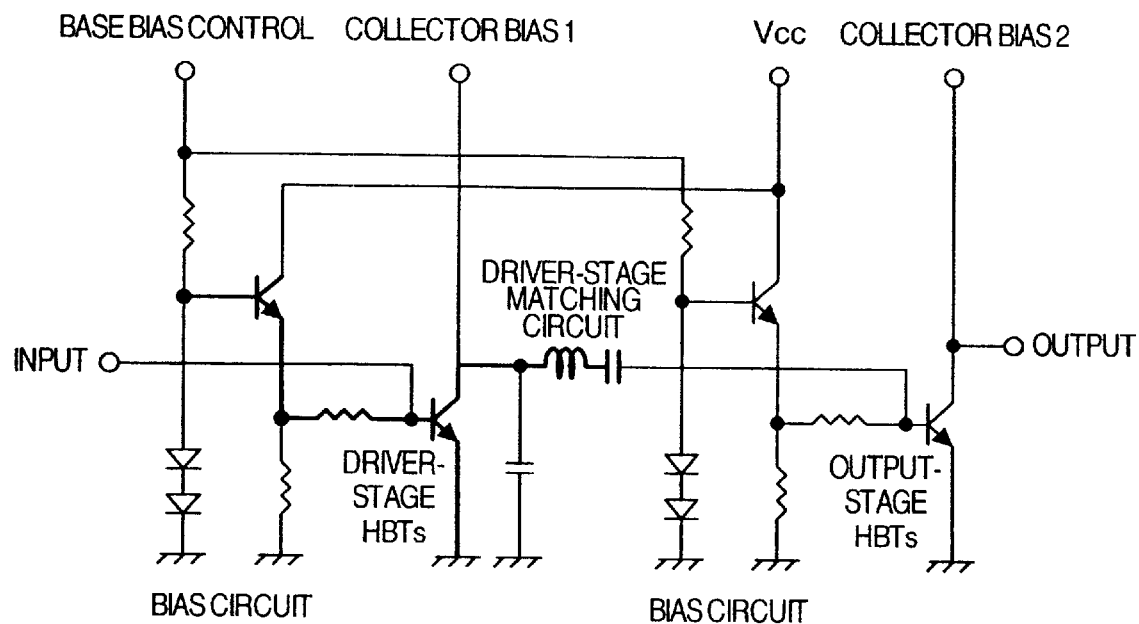
FIG. 23 is a circuit diagram of a two-stage amplifier.
Figure 24:
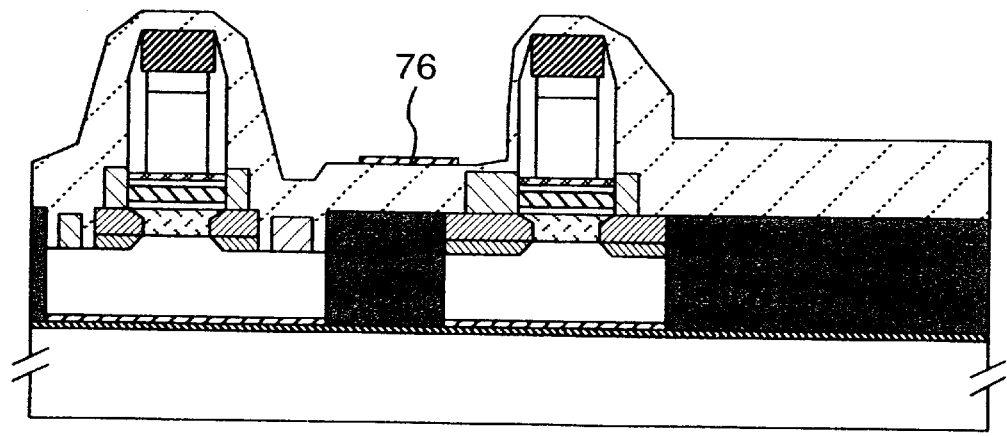
FIG. 24 shows production steps of a semiconductor device of the eighth example of the present invention.
Figure 25:
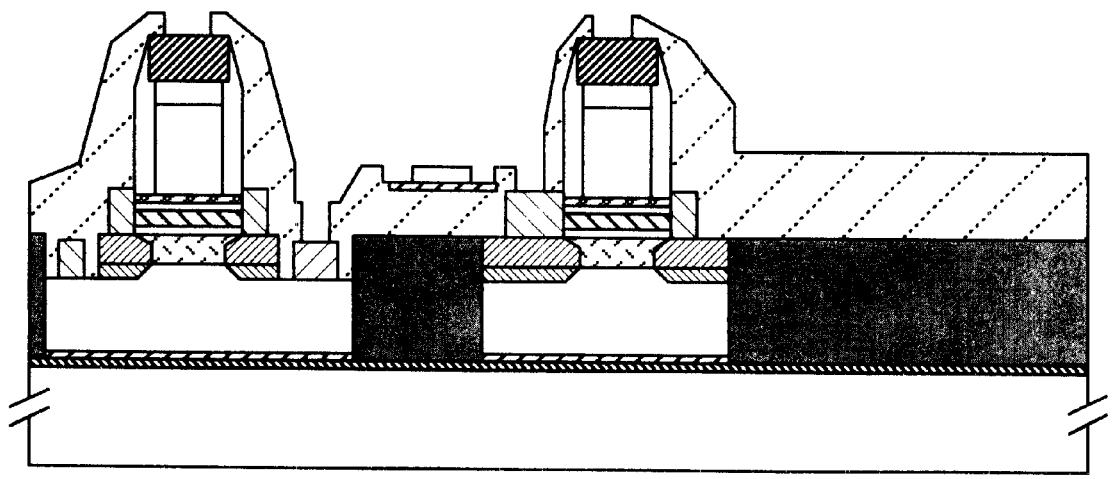
FIG. 25 shows production steps of a semiconductor device of the eighth example of the present invention.

Thereafter, an SiO$_2$ film (film thickness 100 nm, a part of the layer insulating film 71 in FIG. 23 and FIG. 25) was deposited at 250° C. by a plasma excitation chemical vapor phase deposition method. Then, contact holes for electrical contact of collector electrode 10, base electrode 11 and emitter electrode 12 with the first wiring metal were formed by photolithography and dry etching using CHF$_3$ and C$_2$F$_6$ (FIG. 25).

Figure 26:
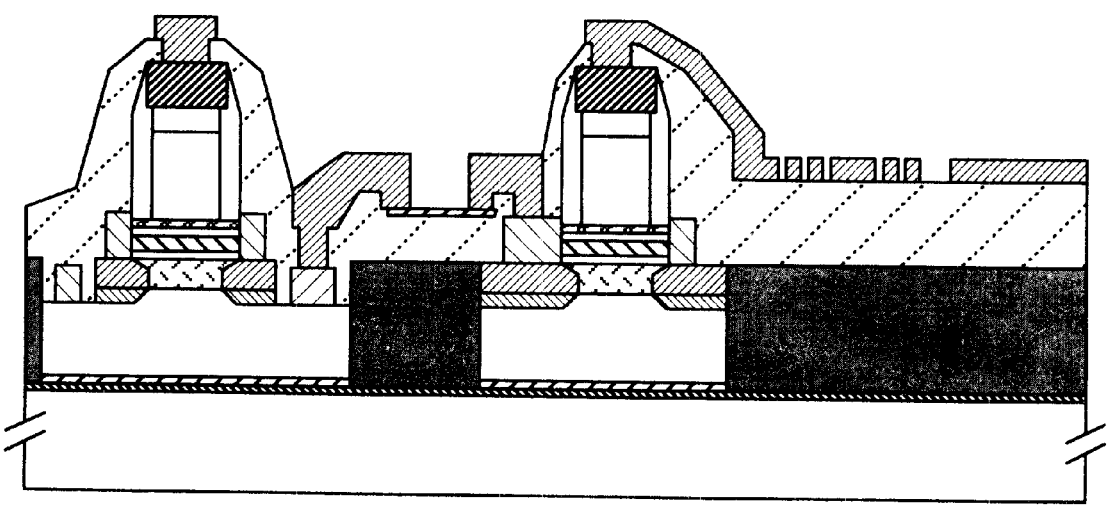
FIG. 26 shows production steps of a semiconductor device of the eighth example of the present invention.

Subsequently, Mo (film thickness 50 nm)/Au (film thickness 800 nm)/Mo (film thickness 50 nm) was deposited on the whole surface by an electron beam vapor deposition method, and the first layer wiring 73 was formed by photolithography and ion milling (FIG. 26).

Figure 27:
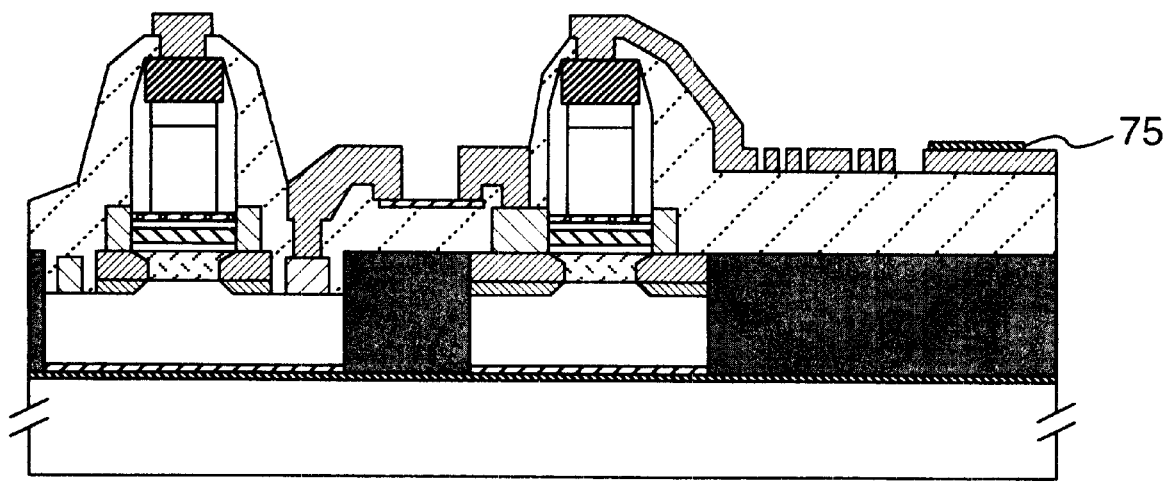
FIG. 27 shows production steps of a semiconductor device of the eighth example of the present invention.
Figure 28:
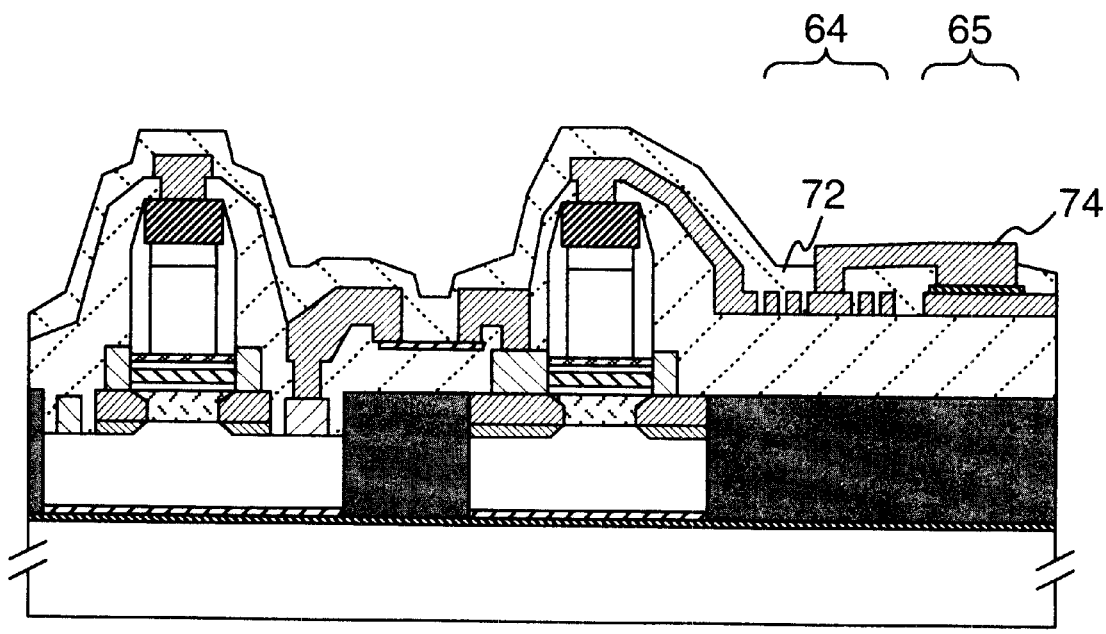
FIG. 28 shows production steps of the semiconductor device of the eighth example of the present invention.

Thereafter, a laminate film comprising SiO$_2$ (film thickness 20 nm)/Si$_3$N$_4$ (film thickness 40 nm)/SiO$_2$ (film thickness 20 nm) was deposited on the whole surface at 250° C. by a plasma excitation chemical vapor phase deposition method, and an insulating film 74 for capacitance element 65 was formed by photolithography and dry etching using CHF$_3$ and C$_2$F$_6$ (FIG. 27). Subsequently, a layer insulating film 72 was formed on the whole surface using a coating insulating film, and contact holes for electrical contact of a part of the inductance element 64 with capacitance element 65 were formed by photolithography and dry etching using CHF$_3$ and C$_2$F$_6$. Thereafter, Mo (film thickness 50 nm)/Au (film thickness 800 nm)/Mo (film thickness 50 nm) was deposited on the whole surface by an electron beam vapor deposition method, and the second layer wiring 74 was formed by photolithography and ion milling (FIG. 28).

Then, the surface of the sample was applied to a glass substrate with an adhesive, and the GaAs (or InP) substrate 1 was mechanically thinned to 80 μm. Thereafter, using a two-side contact aligner, a pattern for heat-radiation hole was formed in conformity with the pattern on the surface side, and a heat-radiation hole of 50 μm in depth was formed by dry etching using a mixed gas plasma comprising $SiCl_4$ and $SF_6$. The heat-radiation hole of the remaining 30 μm was removed by wet etching using a mixed solution comprising sulfuric acid, hydrogen peroxide and water. In this case, etching was stopped at the etch stop layer 25, and the back-side emitter contact layer 26 was exposed in the heat-radiation hole by the subsequent removal of the etch stop layer with an aqueous hydrochloric acid solution. Finally, Ti (film thickness 50 nm)/Pt (film thickness 50 nm)/Au (film thickness 4 μm) were formed as back-side emitter non-alloy electrode on the whole back side by electron beam vapor deposition and Au plating to obtain a monolithic-microwave integrated circuit shown in FIG. 22.

According to this example, there is obtained an effect of being able to providing a monolithic-microwave integrated circuit of power amplifier having at least one features of high power conversion efficiency, high power gain, low cost, high reliability and high reproducibility.

EXAMPLE 9

Figure 29:
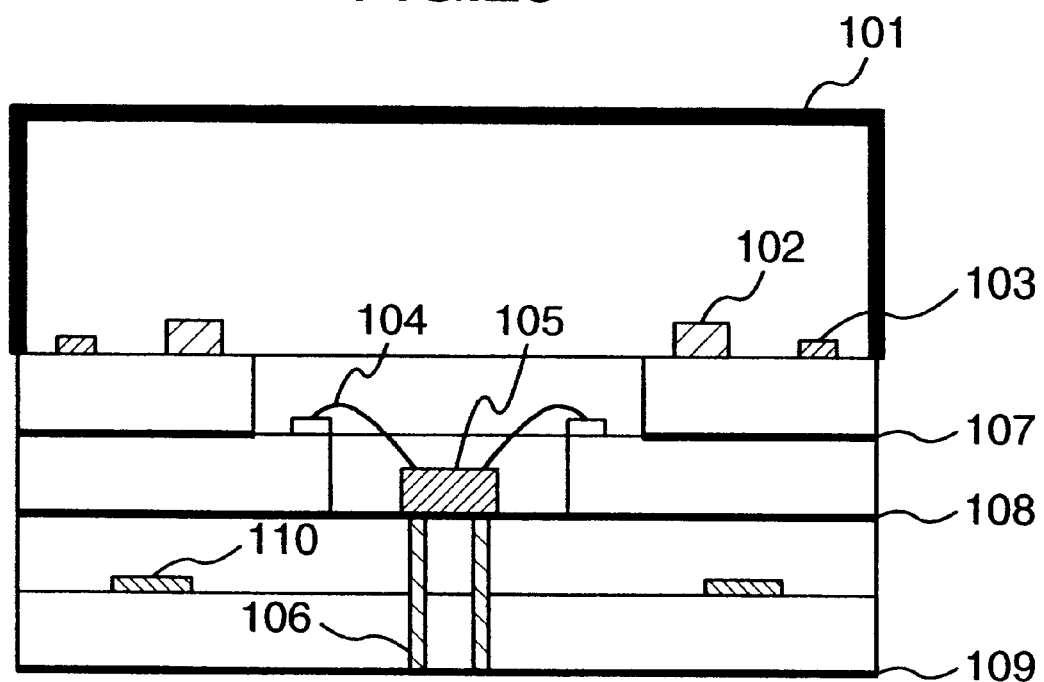
FIG. 29 is a longitudinal sectional view showing the structure of the semiconductor device of the ninth example of the present invention.

FIG. 29 shows a mobile power amplifier module produced using the monolithic-microwave integrated circuit shown in Example 8. A low-temperature fired glass ceramics substrate having a specific dielectric constant of 8 was used as a package. The size was 6 mm×6 mm, which was smaller than 7 mm×7 mm of prior art. 101 indicates a metallic cap and 102 indicates a chip part. 103 indicates a transmission line and a laminate film of Ag and Pt was formed by thick film screen printing. 105 indicates the monolithic-microwave integrated circuit shown in Example 8, and the back side thereof was electrically connected to a ground layer 108 with an Ag paste. The electrode pads for input and output disposed on the surface of 105 were drawn out of the chip by wire bonding 104. 106 indicates a thermal via, and 107 and 109 indicate the same ground layer as of 108.

According to this example, since the monolithic-microwave integrated circuit shown in Example 8 which was superior in heat radiation and small in chip area was used, a mobile power amplifier module of small volume can be produced. Furthermore, there is no generation of emitter inductance caused by wire bonding which was a problem in conventional emitter top HBT, and since the back side of the monolithic-microwave integrated circuit 105 is directly connected to the electrically stable ground layer 108, there can be obtained a mobile power amplifier module having no variability in production and excellent in high frequency characteristics.

EXAMPLE 10

Figure 30:
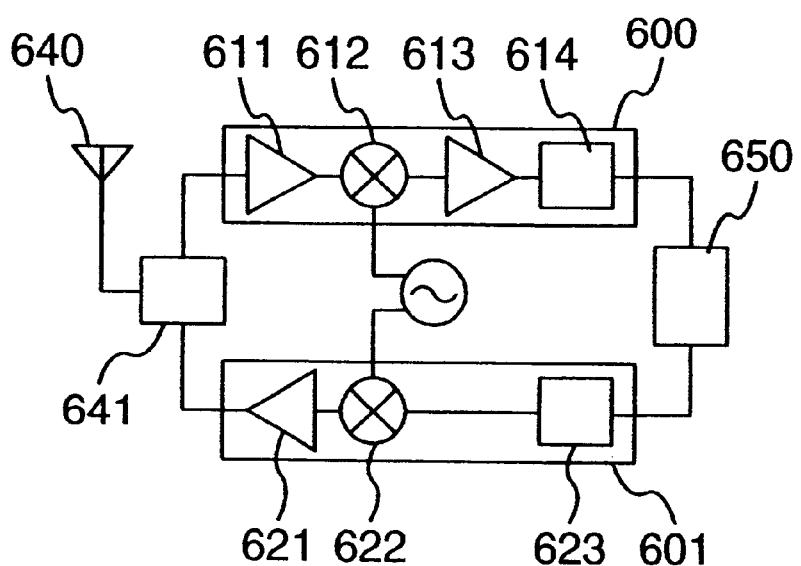
FIG. 30 is a block diagram of a mobile communication equipment.

FIG. 30 is a block diagram which shows a construction where the high-output amplifier module to which the semiconductor device of the present invention shown in Example 9 (FIG. 29) was used in mobile communication equipment represented by portable telephone.

In the mobile communication equipment shown in FIG. 30, a receiving radio wave (assumed to be 0.8 GHz to 2 GHz here) from a transmitter is received by an antenna 640. The radio wave received by the antenna 640 enters a receiving part 600 as an electric signal through antenna multicoupler 641. The electric signal sent to the receiving part 600 is first amplified by a low noise amplifier 611. The amplified signal of 0.8 GHz to 2 GHz is converted to, for example, a signal of about 500 kHz. In this frequency conversion, an intermediate frequency generated at a frequency synthesizer 630 is used, and this is performed by synchronizing at receiving mixer 612. The signal converted to the intermediate frequency is amplified by intermediate frequency amplifier 613.

Since the signal received by antenna 640 has been subjected to signal processing (which changes at least one of amplitude, frequency and phase), it is demodulated by demodulator 614. The signal leaving the demodulator 614 is sent to controlling part 650. The signal reaching the controlling part 650 is sent to telephone receiver from the received signal processing circuit to be converted to an aural signal.

On the other hand, in the case of transmitting an aural signal, the signal is transmitted to a modulator 623 of transmitting part 601 through telephone transmitter and transmission signal processing apparatus in the controlling part 650 and is modulated. The modulated signal is converted to high-frequency wave by transmitter mixer 622 and amplified by power amplifier 621, and then is transmitted from antenna 640 through the antenna multicoupler 622. The power amplifier module of the present invention is used as the power amplifier 621 of the transmitting part 601. For the conversion to high-frequency wave in the transmitter mixer 622, a high-frequency wave of 0.8 GHz to 2 GHz generated in the frequency synthesizer is used.

As is clear from the above explanation, the frequency synthesizer 630 can generate a plurality of frequencies. Moreover, the antenna multicoupler acts as a transmission and reception switch, and transmits as an electric signal the radio wave received by the antenna 640 in the case of reception and transmits the signal transmitted from the transmitting part 601 to the antenna 640.

According to this example, as a result of improvement in power conversion efficiency of the power amplifier which is greatest in power consumption in the mobile communication equipment, there is an effect of being able to prolong the talking time obtainable by one charging of battery to more than the talking time obtainable in the prior art communication equipment.

EXAMPLE 11

Figure 33:
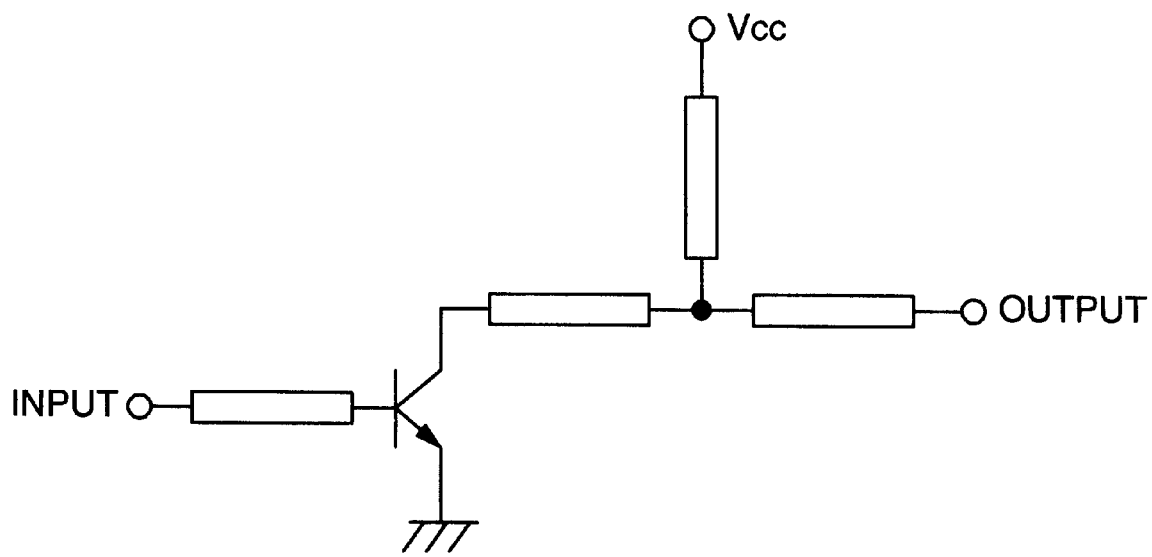
FIG. 33 is a circuit diagram of millimeter-wave common-emitter amplifier.
Figure 34:
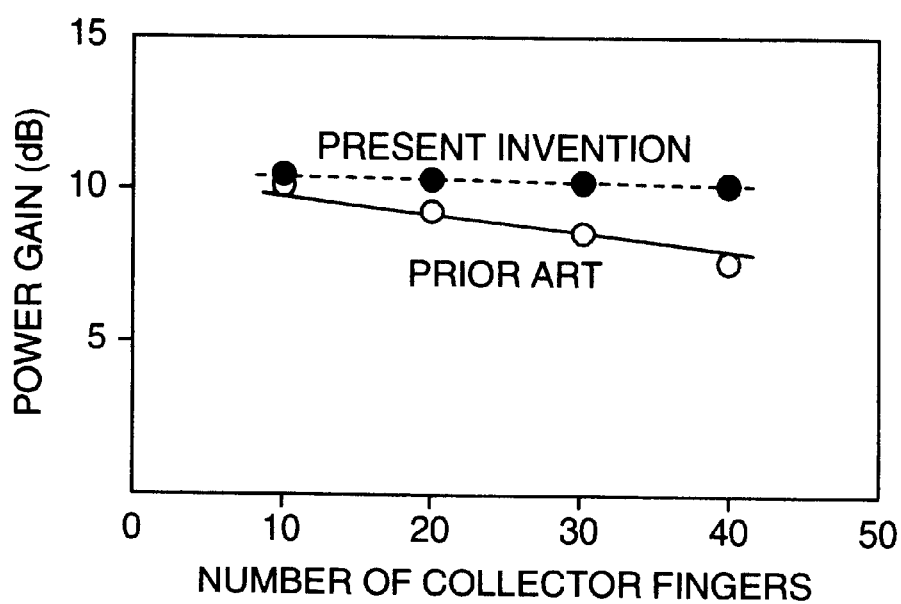
FIG. 34 is a graph which shows the results of measurement of dependence of power gain on the number of collector fingers in millimeter-wave common-emitter amplifiers according to a prior art and the present invention.

FIG. 33 is a circuit diagram of a common emitter millimeter-wave common-emitter amplifier. The emitter is directly connected to the ground while the transmission line is connected to the base and the collector. FIG. 34 shows experimental results which show the dependence, on the number of collector fingers, of the power gain at 38 GHz of the amplifier having the circuit construction shown in FIG. 33. In the case of the prior art collector top HBT, the power gain decreased with increase of the number of the collector fingers due to the influence of emitter impedance. On the other hand, in the case of the collector top HBT of the present invention, especially, the collector top HBT using a back-side emitter electrode shown in Examples 3 and 4, since the emitter impedance was only the micro-resistance produced by the contact resistance of the back-side emitter electrode, the power gain did not depend on the number of the collector fingers and was constant.

According to this example, the number of collector fingers required for obtaining a necessary output power can be small, and, hence, there is an effect of being able to realize an amplifier small in chip area in millimeter wave region, low in cost and high in power gain.

According to the present invention, the dependence of current gain in collector top HBT on collector size can be diminished.

What is claimed is:

1. A method for producing a collector top heterojunction bipolar transistor which comprises a step of growing an emitter layer comprising an n-type compound semiconductor on a single crystal semiconductor substrate, a step of growing on the emitter layer a base layer comprising a p-type compound semiconductor smaller in forbidden band width than the compound semiconductor constituting the emitter layer, a step of processing the base layer into a desired shape, and a step of forming by ion implantation a high resistance extrinsic emitter area in the area of the emitter layer which is not covered with the base layer.

2. A method for producing a collector top heterojunction bipolar transistor according to claim 1, wherein the ion implantation comprises implanting ion of at least one element of hydrogen, helium, beryllium, boron, carbon, nitrogen, oxygen, fluorine and neon.

3. A method for producing a collector top heterojunction bipolar transistor according to claim 1, wherein the single crystal semiconductor comprises GaAs, the emitter layer comprises InGaP or AlGaAs, and the base layer comprises GaAs.

4. A method for producing a collector top heterojunction bipolar transistor according to claim 1, wherein the single crystal semiconductor comprises InP, the emitter layer comprises InAlGaAs or InP, and the base layer comprises InGaAs.

* * * * *